(12) United States Patent
Zhang et al.

(10) Patent No.: US 12,232,313 B2
(45) Date of Patent: Feb. 18, 2025

(54) STAIRCASE STRUCTURE IN THREE-DIMENSIONAL MEMORY DEVICE AND METHOD FOR FORMING THE SAME

(71) Applicant: YANGTZE MEMORY TECHNOLOGIES CO., LTD., Wuhan (CN)

(72) Inventors: Zhong Zhang, Wuhan (CN); Zhongwang Sun, Wuhan (CN); Wenxi Zhou, Wuhan (CN); Zhiliang Xia, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 18/144,650

(22) Filed: May 8, 2023

(65) Prior Publication Data

US 2023/0276620 A1    Aug. 31, 2023

Related U.S. Application Data

(63) Continuation of application No. 16/881,168, filed on May 22, 2020, now Pat. No. 11,696,439, which is a
(Continued)

(51) Int. Cl.
*H10B 41/20* (2023.01)
*H10B 41/10* (2023.01)
(Continued)

(52) U.S. Cl.
CPC ............. *H10B 41/20* (2023.02); *H10B 41/10* (2023.02); *H10B 41/35* (2023.02); *H10B 43/10* (2023.02); *H10B 43/20* (2023.02); *H10B 43/35* (2023.02)

(58) Field of Classification Search
CPC ......... H01L 27/11551; H01L 27/11519; H01L 27/11524; H01L 27/11565; H01L 27/1157;
(Continued)

(56) References Cited

U.S. PATENT DOCUMENTS 9,853,051 B1    12/2017  Lee
9,960,181 B1     5/2018  Cui et al.
(Continued)

FOREIGN PATENT DOCUMENTS

CN    106910742 A    6/2017
CN    107039457 A    8/2017
(Continued)

OTHER PUBLICATIONS

International Search Report issued in corresponding International Application No. PCT/CN2020/080668, mailed Dec. 21, 2020, 4 pages.
(Continued)

*Primary Examiner* — Shahed Ahmed
*Assistant Examiner* — Khatib A Rahman
(74) *Attorney, Agent, or Firm* — BAYES PLLC

(57) ABSTRACT

In an example, a three-dimensional (3D) memory device includes a memory array structure including a first and a second memory array structures, a staircase structure between the first and a second memory array structures in a first lateral direction and including a first and a second staircase zones, and a bridge structure between the first and second staircase zones in a second lateral direction perpendicular to the first lateral direction. Each of the first and second staircase zones includes first and second sub-staircases arranged alternately. Each first sub-staircase includes ascending stairs at different depths. Each second sub-staircase includes descending stairs at different depths. At least
(Continued)

one stair in each of the first and second sub-staircases is connected to at least one of the first and second memory array structures through the bridge structure.

20 Claims, 14 Drawing Sheets

Related U.S. Application Data continuation of application No. PCT/CN2020/080670, filed on Mar. 23, 2020.

(51) Int. Cl.
*H10B 41/35* (2023.01)
*H10B 43/10* (2023.01)
*H10B 43/20* (2023.01)
*H10B 43/35* (2023.01)

(58) Field of Classification Search
CPC ......... H01L 27/11578; H01L 27/11556; H01L 27/11548; H01L 27/11575; H01L 27/11582; H01L 27/11568; H01L 27/11507; H01L 27/11521; H01L 27/1159; H10B 41/20; H10B 41/10; H10B 41/35; H10B 43/10; H10B 43/20; H10B 43/35; H10B 41/27; H10B 43/27; H10B 41/50; H10B 43/50; H10B 41/30; H10B 51/30; H10B 53/30; H10B 43/30
See application file for complete search history.

(56) References Cited

U.S. PATENT DOCUMENTS

| | | | |
|---|---|---|---|
| 10,790,295 B2* | 9/2020 | Zhao | H10B 41/30 |
| 10,797,075 B2* | 10/2020 | Xiao | H10B 43/40 |
| 10,840,252 B2* | 11/2020 | Kim | H10B 41/10 |
| 10,847,534 B2* | 11/2020 | Chu | H10B 43/27 |
| 10,896,844 B2* | 1/2021 | Zhou | H01L 21/31144 |
| 11,139,237 B2* | 10/2021 | Shao | H10B 43/35 |
| 11,145,671 B2* | 10/2021 | Lee | H10B 41/27 |
| 11,158,577 B2* | 10/2021 | Ong | H01L 21/76805 |
| 11,239,248 B2 | 2/2022 | Xu et al. | |
| 2012/0306089 A1 | 12/2012 | Freeman et al. | |
| 2016/0322297 A1 | 11/2016 | Kim | |
| 2017/0033117 A1 | 2/2017 | Lee | |
| 2017/0200676 A1 | 7/2017 | Jeong et al. | |
| 2017/0256551 A1 | 9/2017 | Lee | |
| 2017/0317088 A1 | 11/2017 | Lee | |
| 2017/0373088 A1 | 12/2017 | Lee | |
| 2018/0069021 A1 | 3/2018 | Lee | |
| 2019/0043874 A1 | 2/2019 | Thimmegowda et al. | |
| 2019/0115356 A1 | 4/2019 | Lee | |
| 2019/0139974 A1 | 5/2019 | Sugawara | |
| 2019/0139978 A1* | 5/2019 | Kim | H10B 43/27 |
| 2019/0259703 A1 | 8/2019 | Tessariol et al. | |
| 2020/0020714 A1 | 1/2020 | Oh | |
| 2020/0051983 A1 | 2/2020 | Zhang et al. | |
| 2020/0051998 A1 | 2/2020 | Lee et al. | |
| 2020/0075605 A1 | 3/2020 | Kim et al. | |
| 2020/0303407 A1 | 9/2020 | Miyazaki | |
| 2020/0357813 A1 | 11/2020 | Tanzawa | |
| 2021/0296335 A1 | 9/2021 | Sun et al. | |
| 2021/0358933 A1* | 11/2021 | Hwang | H10B 43/27 |
| 2022/0051979 A1 | 2/2022 | Kuroko | |

FOREIGN PATENT DOCUMENTS

| | | |
|---|---|---|
| CN | 108666320 A | 10/2018 |
| CN | 108878428 A | 11/2018 |
| CN | 109155317 A | 1/2019 |
| CN | 109314114 A | 2/2019 |
| CN | 109346471 A | 2/2019 |
| CN | 109496354 A | 3/2019 |
| CN | 109742077 A | 5/2019 |
| CN | 109754836 A | 5/2019 |
| CN | 109952644 A | 6/2019 |
| CN | 109997225 A | 7/2019 |
| CN | 110534527 A | 12/2019 |
| CN | 110634872 A | 12/2019 |
| CN | 110718553 A | 1/2020 |
| CN | 111492480 B | 7/2021 |
| JP | 2014027104 A | 2/2014 |
| JP | 5960369 B1 | 8/2016 |
| KR | 20180007811 A | 1/2018 |
| TW | 201639118 A | 11/2016 |
| WO | 2016160073 A1 | 10/2016 |
| WO | 2020154997 A1 | 8/2020 |

OTHER PUBLICATIONS

International Search Report issued in corresponding International Application No. PCT/CN2020/080669, mailed Dec. 28, 2020, 5 pages.

Extended European Search Report issued in corresponding European Application No. EP 20 92 7391.1, mailed on Jul. 5, 2022, 12 pages.

Extended European Search Report issued in corresponding International European Application No. 24174671.8, mailed Nov. 15, 2024, 17 pages.

\* cited by examiner

100

STAIRCASE STRUCTURE IN THREE-DIMENSIONAL MEMORY DEVICE AND METHOD FOR FORMING THE SAME

CROSS-REFERENCE TO RELATED APPLICATIONS

This application is a continuation of U.S. application Ser. No. 16/881,168, filed on May 22, 2020, entitled "STAIRCASE STRUCTURE IN THREE-DIMENSIONAL MEMORY DEVICE AND METHOD FOR FORMING THE SAME," which is a continuation of International Application No. PCT/CN2020/080670, filed on Mar. 23, 2020, entitled "STAIRCASE STRUCTURE IN THREE-DIMENSIONAL MEMORY DEVICE AND METHOD FOR FORMING THE SAME," both of which are hereby incorporated by reference in their entireties. This application is also related to U.S. application Ser. No. 16/881,279, filed on May 22, 2020, entitled "STAIRCASE STRUCTURE IN THREE-DIMENSIONAL MEMORY DEVICE AND METHOD FOR FORMING THE SAME," and U.S. application Ser. No. 16/881,339, filed on May 22, 2020, entitled "STAIRCASE STRUCTURE IN THREE-DIMENSIONAL MEMORY DEVICE AND METHOD FOR FORMING THE SAME," both of which are hereby incorporated by reference in their entireties.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices having staircase structures and methods for forming the same are disclosed herein.

In one example, a 3D memory device includes a memory array structure and a staircase structure in an intermediate of the memory array structure and laterally dividing the memory array structure into a first memory array structure and a second memory array structure. The staircase structure includes a first staircase zone and a bridge structure connecting the first memory array structure and the second memory array structure. The first staircase zone includes a first pair of staircases facing each other in a first lateral direction and at different depths. Each staircase includes a plurality of stairs. At least one stair in the first pair of staircases is electrically connected to at least one of the first memory array structure and the second memory array structure through the bridge structure.

In another example, a 3D memory device includes a memory array structure and a staircase structure in an intermediate of the memory array structure and laterally dividing the memory array structure into a first memory array structure and a second memory array structure. The staircase structure includes a first staircase zone and a bridge structure connecting the first memory array structure and the second memory array structure. The first staircase zone includes a first staircase including a plurality of divisions in a second lateral direction. Each division includes a plurality of stairs in a first lateral direction perpendicular to the second lateral direction. A stair in one of the divisions is vertically between two stairs in another one of the divisions. At least one stair in the first staircase is electrically connected to at least one of the first memory array structure and the second memory array structure through the bridge structure.

In still another example, a method for forming a staircase structure of a 3D memory device is disclosed. A staircase zone mask including openings for a first staircase zone and a second staircase zone in an intermediate of a stack structure including vertically interleaved first material layers and second material layers is patterned. In each of the first and second staircase zones, at least one pair of staircases facing each other in a first lateral direction at a same depth are formed, such that a bridge structure is formed between the first and second staircase zones in a second lateral direction perpendicular to the first lateral direction. In each of the first and second staircase zones, each staircase of the at least one pair of staircases is chopped to different depths.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
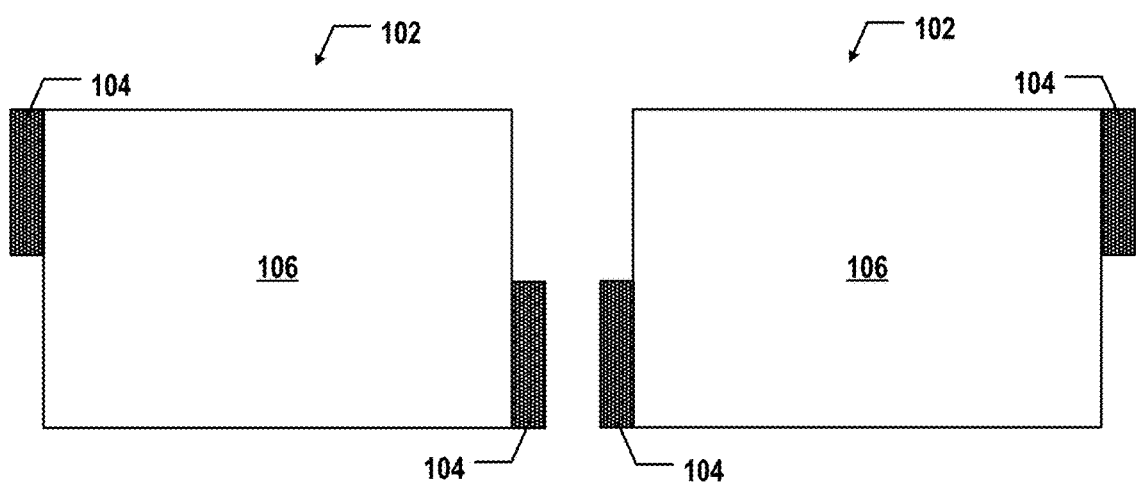
FIG. 1 illustrates a schematic diagram of a 3D memory device having staircase structures.
Figure 1:
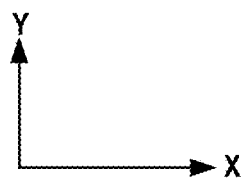

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, memory cells for storing data are vertically stacked through a stacked storage structure (e.g., a memory stack). 3D memory devices usually include staircase structures formed on one or more sides (edges) of the stacked storage structure for purposes such as word line fan-out. As staircase structures are usually formed at the edges of each memory plane, memory cells are unilaterally driven by row decoders (also known as "x-decoders") also arranged at the edges of each memory plane through the word lines and corresponding staircase structures.

For example, FIG. 1 illustrates a schematic diagram of a 3D memory device 100 having staircase structures 104. 3D memory device 100, such as a 3D NAND memory device, includes two memory planes 102 each having a memory cell array in a memory array structure 106. It is noted that x and y axes are included in FIG. 1 to illustrate two orthogonal (perpendicular) directions in the wafer plane. The x-direction is the word line direction of 3D memory device 100, and the y-direction is the bit line direction of 3D memory device 100. 3D memory device 100 also includes two staircase structures 104 at opposite sides in the x-direction of each memory array structure 106. Each word line of memory plane 102 extends laterally in the x-direction across the entire memory plane 102 to a respective stair (level) in staircase structure 104. A row decoder (not shown) is formed right above, below, or in proximity to respective staircase structure 104 to reduce the interconnect length. That is, each row decoder unilaterally (either in the positive or negative x-direction, but not both) drives one-half of the memory cells through one-half of the word lines, each of which crosses the entire memory plane 102.

The load of the unilateral row word line-driving scheme thus includes the resistance of the entire word line across memory plane 102. Moreover, as the demand for higher storage capacity continues to increase, the number of vertical levels of the stacked storage structure increases, and the thickness of the stack layers, including each word line film, decreases. Thus, an even higher resistance can be introduced into the load, thereby causing a significant resistive-capacitive (RC) delay. Accordingly, the performance of 3D memory device 100, such as read and write speed, can be affected by the unilateral word line-driving scheme with side staircase structures 104.

Various embodiments in accordance with the present disclosure provide staircase structures in the intermediate of memory planes and fabrication methods thereof to enable a bilateral word line-driving scheme for reducing RC delay. By replacing the conventional side staircase structures with, for example, center staircase structures, each row decoder can bilaterally drive word lines in opposite directions from the middle of the memory plane, such that the resistance in the load can be reduced as the length of the word line to be driven by the row decoder decreases, for example, to one half. In some embodiments, a bridge structure is introduced as part of the staircase structures to connect the word line separated by the center staircase structure. In some embodiments, a multi-division staircase structure, in which each stair of the staircase structure includes multiple divisions for fan-out multiple word lines, is used to increase the utilization of the staircase structure and reduce the fabrication complexity. In some embodiments, multiple chopping processes are used to form multiple staircases at different depths to reduce the number of trim-etch processes, thereby further reducing the fabrication complexity and increasing the yield.

Figure 2:
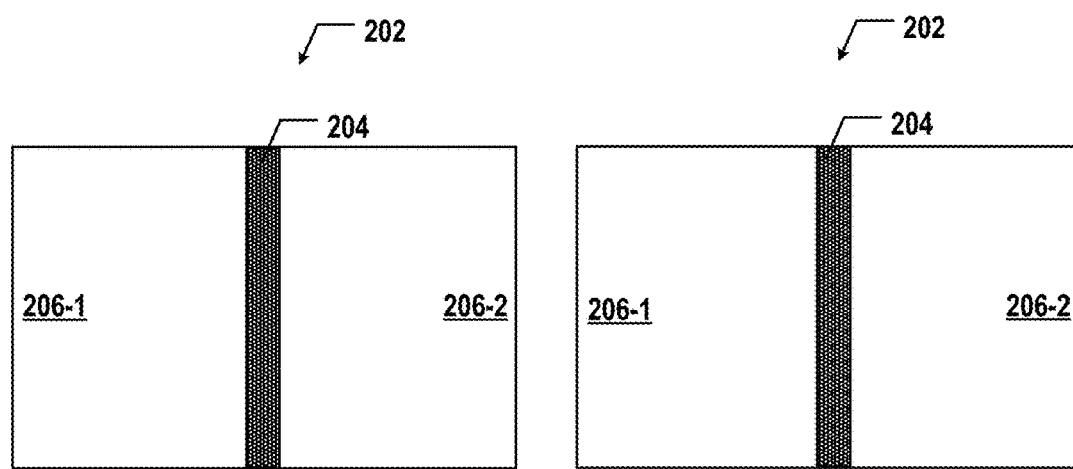
FIG. 2 illustrates a schematic diagram of an exemplary 3D memory device having staircase structures, according to some embodiments of the present disclosure.

FIG. 2 illustrates a schematic diagram of an exemplary 3D memory device 200 having staircase structures 204, according to some embodiments of the present disclosure. In some embodiments, 3D memory device 200 includes multiple memory planes 202. Each memory plane 202 can include a memory array structure 206-1/206-2 and a staircase structure 204 in the intermediate of memory array structure 206-1/206-2 and laterally dividing memory array structure 206-1/206-2 into a first memory array structure 206-1 and a second memory array structure 206-2 in the x-direction (the word line direction). Different from 3D memory device 100 in FIG. 1 in which staircase structures 104 are at opposite sides of each memory array structure 106, staircase structure 204 in 3D memory device 200 is in the intermediate between first and second memory array structures 206-1 and 206-2, according to some embodiments. In some embodiments, for each memory plane 202, staircase structure 204 is in the middle of memory array structure 206-1/206-2. That is, staircase structure 204 can be a center staircase structure, which equally divides memory array structure 206-1/206-2 into first and second memory array structures 206-1 and 206-2 with the same number of memory cells. For example, first and second memory array structures 206-1 and 206-2 may be symmetric in the x-direction with respect to center staircase structure 204. It is understood that in some examples, staircase structure 204 may be in the intermediate, but not in the middle (center), of memory array structure 206-1/206-2, such that first and second memory array structures 206-1 and 206-2 may have different sizes and/or numbers of memory cells. In some embodiments, 3D memory device 200 is a NAND Flash memory device in which memory cells are provided in the form of an array of NAND memory strings (not shown) in first and second memory array structures 206-1 and 206-2. First and second memory array structures 206-1 and 206-2 can include any other suitable components including, but not limited to, gate line slits (GLSs), through array contacts (TACs), array common sources (ACSs), etc.

Each word line (not shown) of memory plane 202 extending laterally in the x-direction can be separated by staircase structure 204 into two parts: a first word line part across first memory array structure 206-1, and a second word line part across second memory array structure 206-2. As described below in detail, the two parts of each word line can be electrically connected by a bridge structure (not shown) in staircase structure 204 at a respective stair in staircase structure 204. A row decoder (not shown) can be formed right above, below, or in proximity to respective staircase structure 204 to reduce the interconnect length. As a result, different from the row decoder of 3D memory device 100 in FIG. 1, each row decoder of 3D memory device 200 can bilaterally (both in the positive and negative x-directions) drive the memory cells in first and second memory array structures 206-1 and 206-2. That is, by replacing the conventional side staircase structures (e.g., 104 in FIG. 1) with, for example, staircase structures 204 in the intermediate of memory array structure 206-1/206-2, each row decoder can bilaterally drive word lines in opposite directions from the intermediate of memory plane 202, such that the resistance in the load can be reduced as the length of the part of each word line to be driven by the row decoder decreases, for example, to one half when staircase structure 204 is in the middle of memory array structure 206-1/206-2. That is, the row decoder of 3D memory device 200 only needs to drive either the first word line part or the second word line part of each word line, according to some embodiments.

Although in FIG. 2, staircase structures 204 each in the intermediate of respective memory plane 202 are functional staircase structures used for landing interconnects (e.g., word line contacts), it is understood that additional staircase structures (e.g., dummy staircase structures, not shown) may be formed at one or more sides as well for balancing load in etching or chemical mechanical polishing (CMP) processes during fabrication and for separating adjacent memory planes 202. As staircase structures 204 each in the intermediate of respective memory plane 202 can increase the total area of memory plane 202, steeper dummy staircase structures with smaller areas can be formed to reduce the die size.

Figure 3:
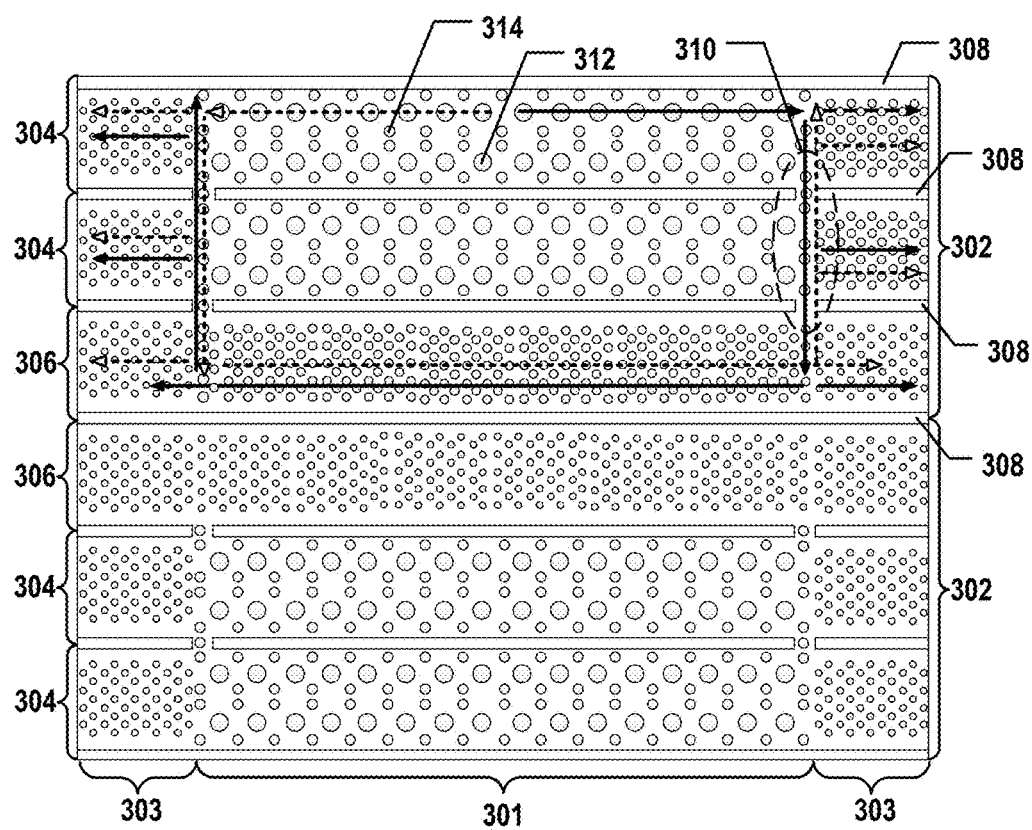
FIG. 3 illustrates a plan view of an exemplary 3D memory device having a staircase structure, according to some embodiments of the present disclosure.

FIG. 3 illustrates a plan view of an exemplary 3D memory device 300 having a staircase structure 301, according to some embodiments of the present disclosure. 3D memory device 300 may be one example of part of memory plane 202 in FIG. 2 that includes staircase structure 204, and staircase structure 301 of 3D memory device 300 may be one example of staircase structure 204 in memory plane 202. As shown in FIG. 3, 3D memory device 300 can include multiple blocks 302 in the y-direction (the bit line direction) separated by parallel GLSs 308. In some embodiments in which 3D memory device 300 is a NAND Flash memory device, each block 302 is the smallest erasable unit of the NAND Flash memory device. Each block 302 can further include multiple fingers 304 in the y-direction separated by some of GLSs 308 with "H" cuts 310.

In some embodiments, staircase structure 301 is in the intermediate (e.g., the middle) of 3D memory device 300 in the x-direction (the word line direction). In some embodiments, FIG. 3 also shows a pair of peripheral regions 303 of the memory array structure adjacent to staircase structure 301. Peripheral regions 303 separated by staircase structure 301 can be used to form top select gates (TSGs), which can be individually driven or electrically connected by interconnects over staircase structure 301. As described below in detail, staircase structure 301 can include multiple staircase zones each corresponding to a respective finger 304 and include multiple bridge structures 306 each between two adjacent staircase zones in the y-direction. Each staircase zone can be in one or two blocks 302. 3D memory device 300 can include a plurality of dummy channel structures 314 in the staircase zones and bridge structures 306 to provide mechanical support and/or load balancing. 3D memory device 300 can further include word line contacts 312 in the staircase zones of staircase structure 301 to be each landed on a respective word line (not shown) at each stair of staircase structure 301 for word line driving.

To achieve the bilateral word line-driving scheme, each bridge structure 306 connects (both physically and electrically) the first memory array structure and the second memory array structure (not shown), according to some embodiments. That is, staircase structure 301 does not completely cut off the memory array structure in the intermediate, but instead leaves the first and second memory array structures connected by bridge structures 306 thereof, according to some embodiments. Each word line thus can be bilaterally driven (in both positive and negative x-directions) from a respective word line contact 312 in the staircase zones of staircase structure 301 in the intermediate of 3D memory device 300 through bridge structures 306. For example, FIG. 3 further illustrates exemplary current paths of the bilateral word line-driving scheme with bridge structures 306. A first current path indicated by the solid arrows and a second current path indicated by the hollow arrows represent currents passing through two separate word lines at different levels, respectively.

Figure 4:
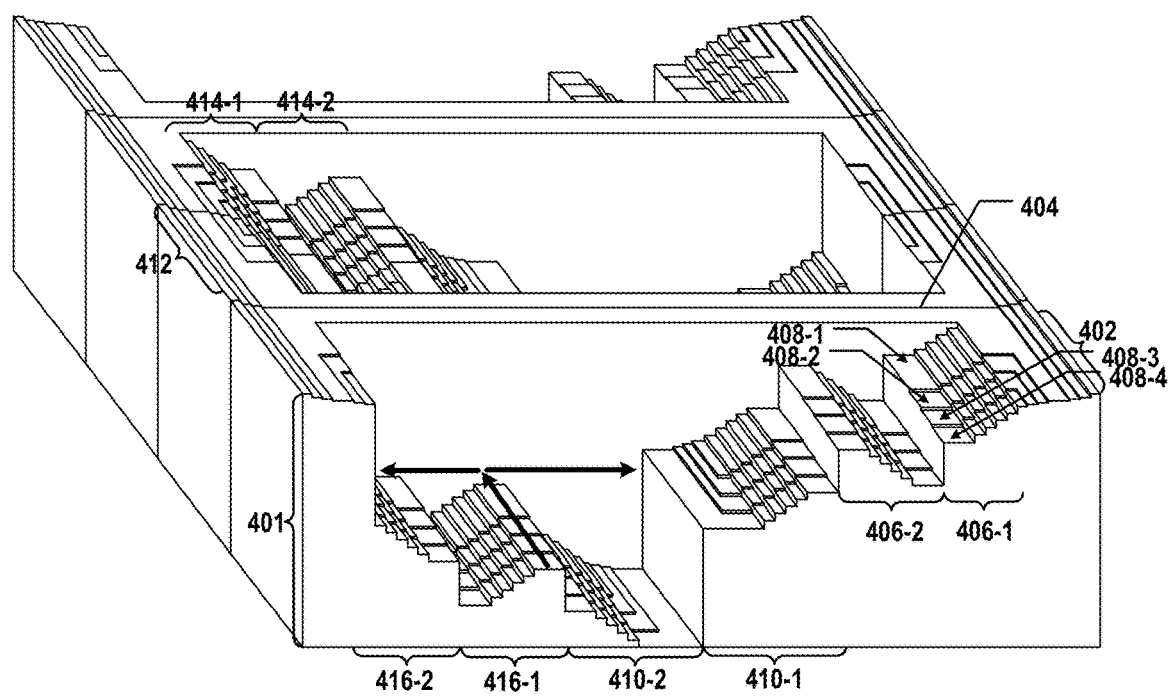
FIG. 4 illustrates a top front perspective view of an exemplary staircase structure of a 3D memory device, according to some embodiments of the present disclosure.

FIG. 4 illustrates a top front perspective view of an exemplary staircase structure 400 of a 3D memory device, according to some embodiments of the present disclosure. Staircase structure 400 may be one example of staircase structure 204 of 3D memory device 200 in FIG. 2 or staircase structure 301 of 3D memory device 300 in FIG. 3. Staircase structure 400 can include a stack structure 401 on a substrate (not shown), which can include silicon (e.g., single crystalline silicon), silicon germanium (SiGe), gallium arsenide (GaAs), germanium (Ge), silicon on insulator (SOI), or any other suitable materials.

It is noted that x, y, and z axes are included in FIG. 4 to further illustrate the spatial relationship of the components in staircase structure 400. The substrate of the 3D memory device includes two lateral surfaces extending laterally in the x-y plane: a top surface on the front side of the wafer on which staircase structure 400 can be formed, and a bottom surface on the backside opposite to the front side of the wafer. The z-axis is perpendicular to both the x and y axes. As used herein, whether one component (e.g., a layer or a device) is "on," "above," or "below" another component (e.g., a layer or a device) of the 3D memory device is determined relative to the substrate of the 3D memory device in the z-direction (the vertical direction perpendicular to the x-y plane) when the substrate is positioned in the lowest plane of the 3D memory device in the z-direction. The same notion for describing the spatial relationship is applied throughout the present disclosure.

Stack structure 401 can include vertically interleaved first material layers and second material layers that are different from the first material layers. The first material layers and second material layers can alternate in the vertical direction. In some embodiments, stack structure 401 can include a plurality of material layer pairs stacked vertically in the z-direction, each of which includes a first material layer and a second material layer. The number of the material layer pairs in stack structure 401 (e.g., 32, 64, 96, 128, 160, 192, 224, or 256) can determine the number of memory cells in the 3D memory device.

In some embodiments, the 3D memory device is a NAND Flash memory device, and stack structure 401 is a stacked storage structure through which NAND memory strings are formed. Each of the first material layers includes a conductive layer, and each of the second material layers includes a dielectric layer. That is, stack structure 401 can include interleaved conductive layers and dielectric layers (not shown). In some embodiments, each conductive layer can function as a gate line of the NAND memory strings and a word line extending laterally from the gate line and ending at staircase structure 400 for word line fan-out. The conductive layers can include conductive materials including, but not limited to, tungsten (W), cobalt (Co), copper (Cu), aluminum (Al), polycrystalline silicon (polysilicon), doped silicon, silicides, or any combination thereof. The dielectric layers can include dielectric materials including, but not limited to, silicon oxide, silicon nitride, silicon oxynitride, or any combination thereof. In some embodiments, the conductive layers include metals, such as tungsten, and the dielectric layers include silicon oxide.

Each stair (as shown as a "level") of staircase structure 400 can include one or more material layer pairs. In some embodiments, the top material layer of each stair is a conductive layer for interconnection in the vertical direction. In some embodiments, every two adjacent stairs of staircase structure 400 are offset by a nominally same distance in the z-direction and a nominally same distance in the x-direction. Each offset thus can form a "landing area" for interconnection with word line contacts (e.g., 312 in FIG. 3, not shown in FIG. 4) of the 3D memory device in the z-direction direction.

As shown in FIG. 4, staircase structure 400 can include a first staircase zone 402, a second staircase zone 412, and a bridge structure 404 between first staircase zone 402 and second staircase zone 412 in the y-direction (the bit line direction). In some embodiments, first staircase zone 402 includes a plurality pairs of staircases including a first pair of staircases 406-1 and 406-2, a second pair of staircases 410-1 and 410-2, and a third pair of staircases 416-1 and 416-2 in the x-direction (the word line direction). Each staircase 406-1, 406-2, 410-1, 410-2, 416-1, or 416-2 includes a plurality of stairs in the x-direction, according to some embodiments. In some embodiments, each staircase 406-1, 406-2, 410-1, 410-2, 416-1, or 416-2 is a functional staircase used for landing interconnects (e.g., word line via contacts), as opposed to a dummy staircase. In other words, none of staircases 406-1, 406-2, 410-1, 410-2, 416-1, and 416-2 in first staircase zone 402 is a dummy staircase, according to some embodiments.

In some embodiments, each pair of staircases 406-1/406-2, 410-1/410-2, or 416-1/416-2 face each other in the x-direction and are at different depths. In one example, first pair of staircases 406-1/406-2 may face each other in the x-direction, e.g., staircase 406-1 tilting toward the negative x-direction, and staircase 406-2 tilting toward the positive x-direction. Similarly, in another example, second pair of staircases 410-1/410-2 may face each other in the x-direction, e.g., staircase 410-1 tilting toward the negative x-direction, and staircase 410-2 tilting toward the positive x-direction. It is understood that since one staircase may include multiple stairs, the depth of a staircase disclosed herein may be referenced to the depth of the same stair in the z-direction (at the same relative level), such as the top stair, the middle stair, or the bottom stair. In one example, first pair of staircases 406-1/406-2 may be at different depths, e.g., the top stair of staircase 406-1 being higher than the top stair of staircase 406-2 in the z-direction. Similarly, in another example, second pair of staircases 410-1/410-2 may be at different depths, e.g., the top stair of staircase 410-1 being higher than the top stair of staircase 410-2 in the z-direction. In some embodiments, each pair of staircases 406-1/406-2, 410-1/410-2, or 416-1/416-2 are not overlapped in the z-direction. That is, the bottom stair of the higher staircase is not lower than the top stair of the lower staircase in the same pair, according to some embodiments.

It is understood that although the number of pairs of staircases in each staircase zone (e.g., first staircase zone 402) is not limited by three as shown in FIG. 4, the same stair pattern described above (i.e., each pair of staircases facing each other in the x-direction and being at different depths) may be applied to any number of pairs of staircases. As a result, in some embodiments, each staircase 406-1, 406-2, 410-1, 410-2, 416-1, or 416-2 in first staircase zone 402 are at different depths. That is, none of staircases 406-1, 406-2, 410-1, 410-2, 416-1, and 416-2 in first staircase zone 402 overlaps in the z-direction, according to some embodiments. Moreover, since each stair in a staircase can be at different depths, each stair in first staircase zone 402 can be at different depths. That is, none of the stairs in first staircase zone 402 overlaps in the z-direction (i.e., not at the same level), according to some embodiments. As a result, each stair in a staircase zone (e.g., first staircase zone 402) can be used for landing interconnects (e.g., word line contacts) in contact with a respective word line at a different level.

As shown in FIG. 4, staircase structure 400 can be a multi-division staircase structure including a plurality of divisions in the y-direction in each staircase zone (e.g., first staircase zone 402 or second staircase zone 412). In some embodiments, each staircase 406-1, 406-2, 410-1, 410-2, 416-1, or 416-2 in first staircase zone 402 includes a plurality of divisions in the y-direction, each of which includes a plurality of stairs in the x-direction. By introducing multiple divisions in the y-direction, the dimension (e.g., the length) of staircase structure 400 in the x-direction can be reduced without reducing the total number of stairs. In some embodiments, in each staircase 406-1, 406-2, 410-1, 410-2, 416-1, or 416-2, a stair in one of the divisions is vertically between two stairs in another one of the divisions. That is, within each staircase, the depths of stairs change first along the y-direction (e.g., increasing in the negative y-direction in FIG. 4) and then change along the x-direction (e.g., increasing in the negative x-direction in FIG. 4). As a result, for any division within a staircase, the depth of at least one stair can be within the depth range of its neighboring division(s). The stair depth pattern among divisions described above can be set based on the sequence of applying the trim-etch process and the division process. Specifically, the stair depth pattern among divisions disclosed herein can be achieved by applying the division process prior to the trim-etch process as described below in detail with respect to the fabrication process. For example, as shown in FIG. 4, staircase structure 400 may be a four-division staircase structure in which each staircase in a staircase zone (e.g., each staircase 406-1, 406-2, 410-1, 410-2, 416-1, or 416-2 in first staircase zone 402) may include four divisions 408-1, 408-2, 408-3, and 408-4 in the y-direction. In one example, in staircase 406-1, there may be intermediate stairs in division 408-2 vertically between the top and bottom stairs in another division 408-1, 408-3, or 408-4. It is understood that the number of divisions is not limited by the example of FIG. 4 and may be any positive integer (i.e., 1, 2, 3, 4, 5, . . . ).

Although first staircase zone 402 is described above in detail, it is understood that the scheme of arranging staircases in first staircase zone 402 disclosed herein may be similarly applied to second staircase zone 412 or any other staircase zones in staircase structure 400. For example, second staircase zone 412 may include a pair of staircases 414-1 and 414-2 (e.g., multi-division staircases) facing each other in the x-direction and at different depths, like first staircase zone 402.

As shown in FIG. 4, first staircase zone 402 and second staircase zone 412 are asymmetric in the y-direction, according to some embodiments. For example, the staircase patterns in first and second staircase zones 402 and 412 may not be symmetric with respect to bridge structure 404. By asymmetrically arranging the staircases in adjacent staircase zones, the mechanical stress introduced by staircase structure 400 can be more evenly distributed. It is understood that in other examples, first staircase zone 402 and second staircase zone 412 may be symmetric in the y-direction as well.

As part of stack structure 401, bridge structure 404 can include vertically interleaved conductive layers and dielectric layers (not shown), and the conductive layers (e.g., metal layers or polysilicon layers) can function as part of word lines. Different from at least some staircases in first and staircase zones 402 and 412 in which the word lines therein are cut off from the memory array structure in the x-direction (e.g., in the positive x-direction, the negative x-direction, or both), the word lines in bridge structure 404 can be preserved to bridge the word line contacts landed on the staircases and the memory array structures in order to achieve the bilateral word line-driving scheme. In some embodiments, at least one stair in a staircase in first or second staircase zone 402 or 412 is electrically connected to at least one of the first memory array structure and the second memory array structure through bridge structure 404. At least one word line can extend laterally in the memory array structure and bridge structure 404, such that the at least one stair can be electrically connected to the at least one of the first and second memory array structures through bridge structure 404 by the at least one word line. In one example, a stair in staircase 406-1 may be electrically connected to the first memory array structure (in the negative x-direction) by a respective word line part extending in the negative x-direction through bridge structure 404. Bridge structure 404, however, may not be needed to electrically connect the same stair to the second memory array structure (in the positive x-direction) because the respective word line part extending in the positive x-direction is not cut off. In another example, a stair in staircase 416-2 may be electrically connected to the second memory array structure (in the positive x-direction) by a respective word line part extending in the positive x-direction through bridge structure 404. Bridge structure 404, however, may not be needed to electrically connect the same stair to the first memory array structure (in the negative x-direction) because the respective word line part extending in the negative x-direction is not cut off.

In some embodiments, the at least one stair in the staircase in first or second staircase zone 402 or 412 is electrically connected to each of the first memory array structure and the second memory array structure through bridge structure 404. For example, as shown in FIG. 4, a stair in staircase 416-1 may be electrically connected to both the first and second memory array structures through bridge structure 404 by the respective word line parts extending in the negative and positive x-directions, respectively, as indicated by the current paths (represented by the arrows).

Figure 8:
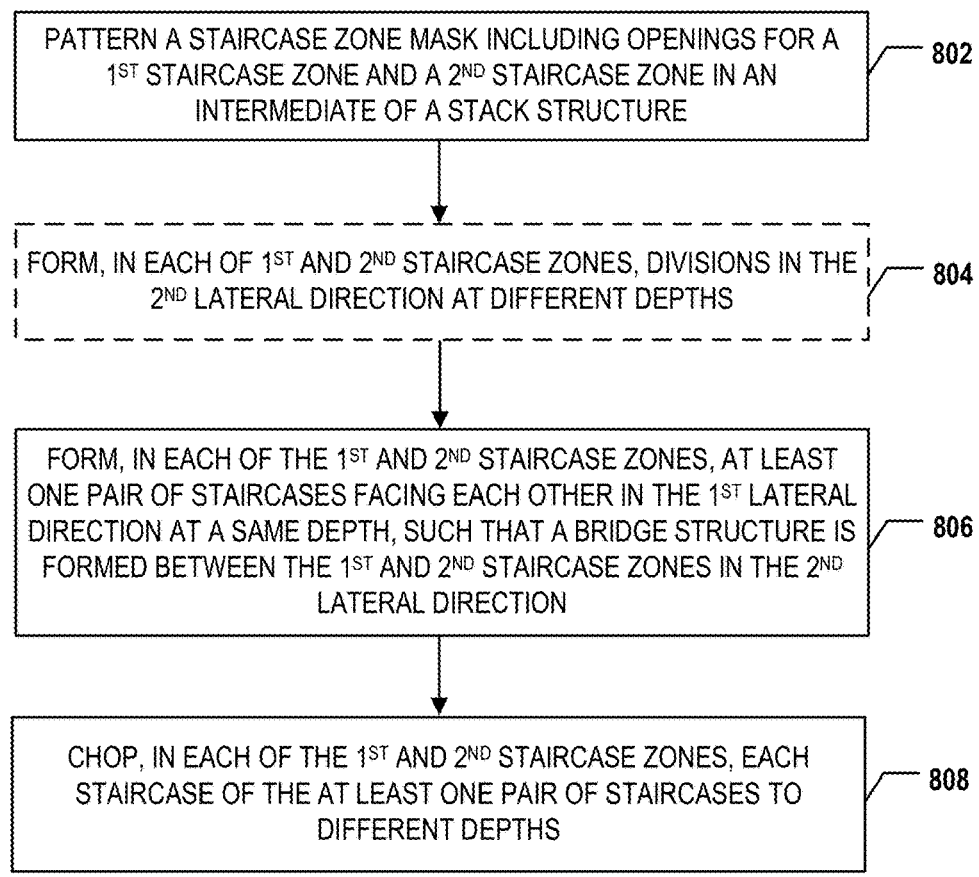
FIG. 8 is a flowchart of a method for forming an exemplary staircase structure of a 3D memory device, according to some embodiments.
Figure 9:
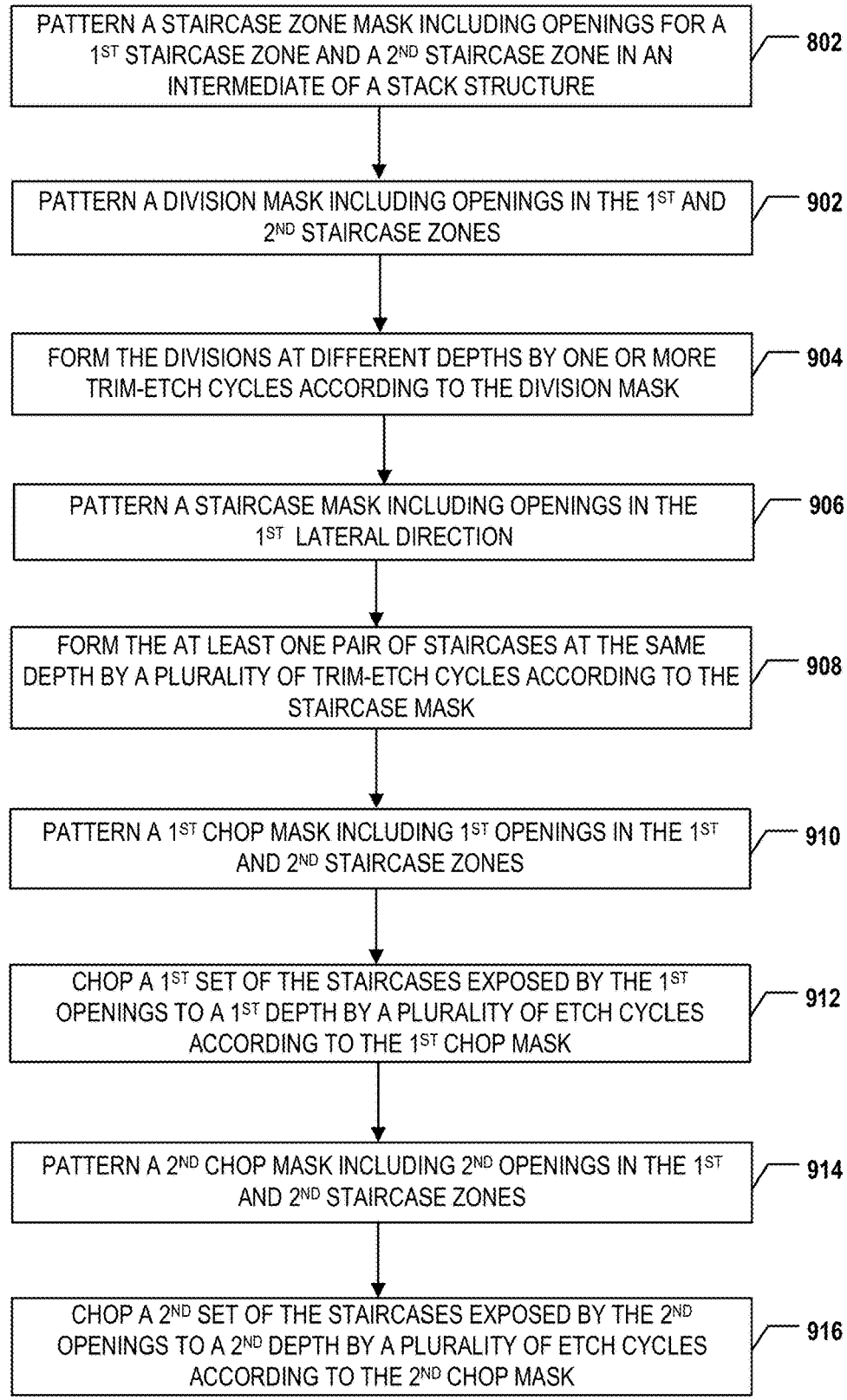
FIG. 9 is a flowchart of another method for forming an exemplary staircase structure of a 3D memory device, according to some embodiments.

FIGS. 5A-5F illustrate various exemplary masks for forming an exemplary staircase structure of a 3D memory device, according to some embodiments of the present disclosure. FIGS. 6A and 6B illustrate a fabrication process for forming an exemplary staircase structure of a 3D memory device, according to various embodiments of the present disclosure. FIG. 8 is a flowchart of a method 800 for forming an exemplary staircase structure of a 3D memory device, according to some embodiments. FIG. 9 is a flowchart of another method 900 for forming an exemplary staircase structure of a 3D memory device, according to some embodiments. Examples of the staircase structures depicted in FIGS. 6A, 6B, 8, and 9 include staircase structure 400 depicted in FIG. 4. FIGS. 5A-5F, 6A, 6B, 8, and 9 will be described together. It is understood that the operations shown in methods 800 and 900 are not exhaustive and that other operations can be performed as well before, after, or between any of the illustrated operations. Further, some of the operations may be performed simultaneously, or in a different order than shown in FIGS. 8 and 9.

Referring to FIG. 8, method 800 starts at operation 802, in which a staircase zone mask including openings for a first staircase zone and a second staircase zone in an intermediate of a stack structure is patterned. In some embodiments, the staircase zone mask includes a hard mask. The stack structure can include vertically interleaved first material layers and second material layers. In some embodiments, the stack structure is a dielectric stack, and each of the first material layers includes a first dielectric layer (also known as a "sacrificial layer"), and each of the second material layers includes a second dielectric layer different from the first dielectric layer. Interleaved first dielectric layers and second dielectric layers can be alternatingly deposited above a substrate.

Referring to FIG. 6A, a stack structure 602 including a plurality pairs of a first dielectric layer (also known as a "sacrificial layer," not shown) and a second dielectric layer (together referred to herein as "dielectric layer pairs," not shown) is formed above a silicon substrate (not shown). That is, stack structure 602 includes interleaved sacrificial layers and dielectric layers, according to some embodiments. The dielectric layers and sacrificial layers can be alternatingly deposited on the silicon substrate to form stack structure 602. In some embodiments, each dielectric layer includes a layer of silicon oxide, and each sacrificial layer includes a layer of silicon nitride. Stack structure 602 can be formed by one or more thin film deposition processes including, but not limited to, chemical vapor deposition (CVD), physical vapor deposition (PVD), atomic layer deposition (ALD), or any combination thereof.

In some embodiments, the stack structure is a memory stack, and each of the first material layers includes a conductive layer, and each of the second material layers includes a dielectric layer. Interleaved conductive layers (e.g., polysilicon layers) and dielectric layers (e.g., silicon oxide layers) can be alternatingly deposited above a substrate. Interleaved conductive layers (e.g., metal layers) and dielectric layers (e.g., silicon oxide layers) can also be formed by a gate replacement process, which replaces the sacrificial layers in the dielectric stack with the conductive layers. That is, the staircase structure can be formed either prior to or after the gate replacement process on a dielectric stack or on a memory stack.

Referring to FIG. 6A, stack structure 602 can include a plurality pairs of a conductive layer and a dielectric layer (together referred to herein as "conductive/dielectric layer pairs"). That is, stack structure 602 includes interleaved conductive layers and dielectric layers, according to some embodiments. In some embodiments, each dielectric layer includes a layer of silicon oxide, and each conductive layer includes a layer of metal, such as tungsten, or a layer of semiconductor, such as polysilicon. In some embodiments, to form stack structure 602, a slit opening (not shown) can be formed through a dielectric stack, the sacrificial layers in the dielectric stack can be etched by applying etchants through the slit opening to form a plurality of lateral recesses, and the conductive layers can be deposited in the lateral recesses using one or more thin film deposition processes including, but not limited to, CVD, PVD, ALD, or any combination thereof.

Figure 5A:
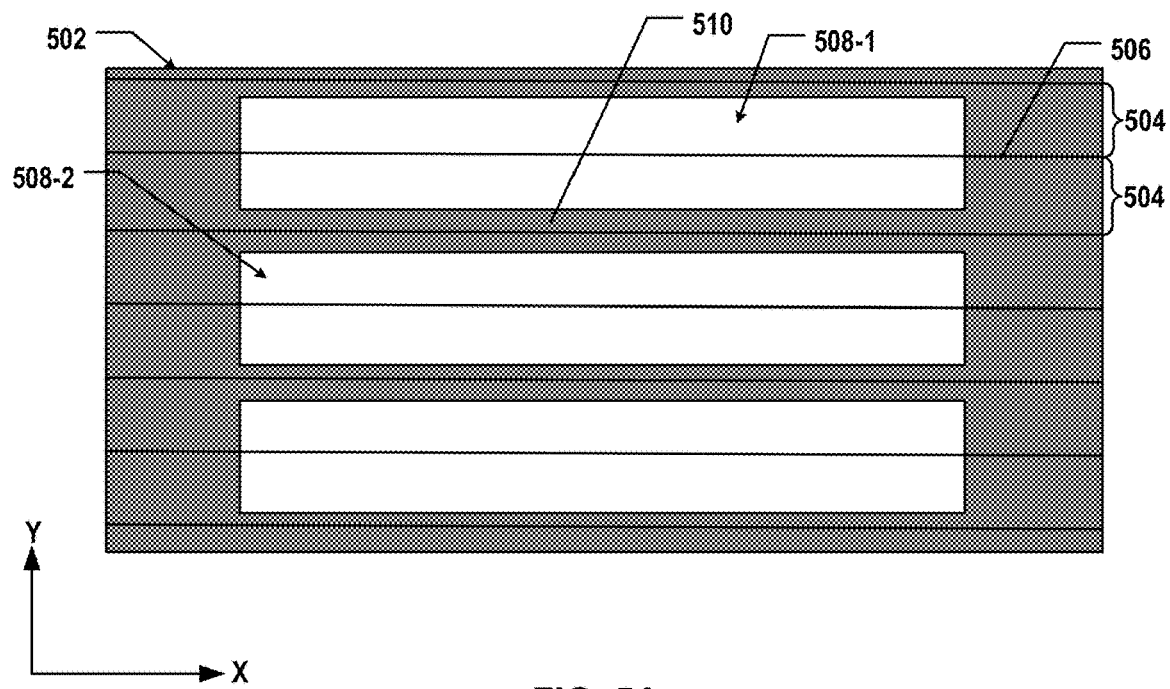
FIGS. 5A-5F illustrate various exemplary masks for forming an exemplary staircase structure of a 3D memory device, according to some embodiments of the present disclosure.
Figure 6A:
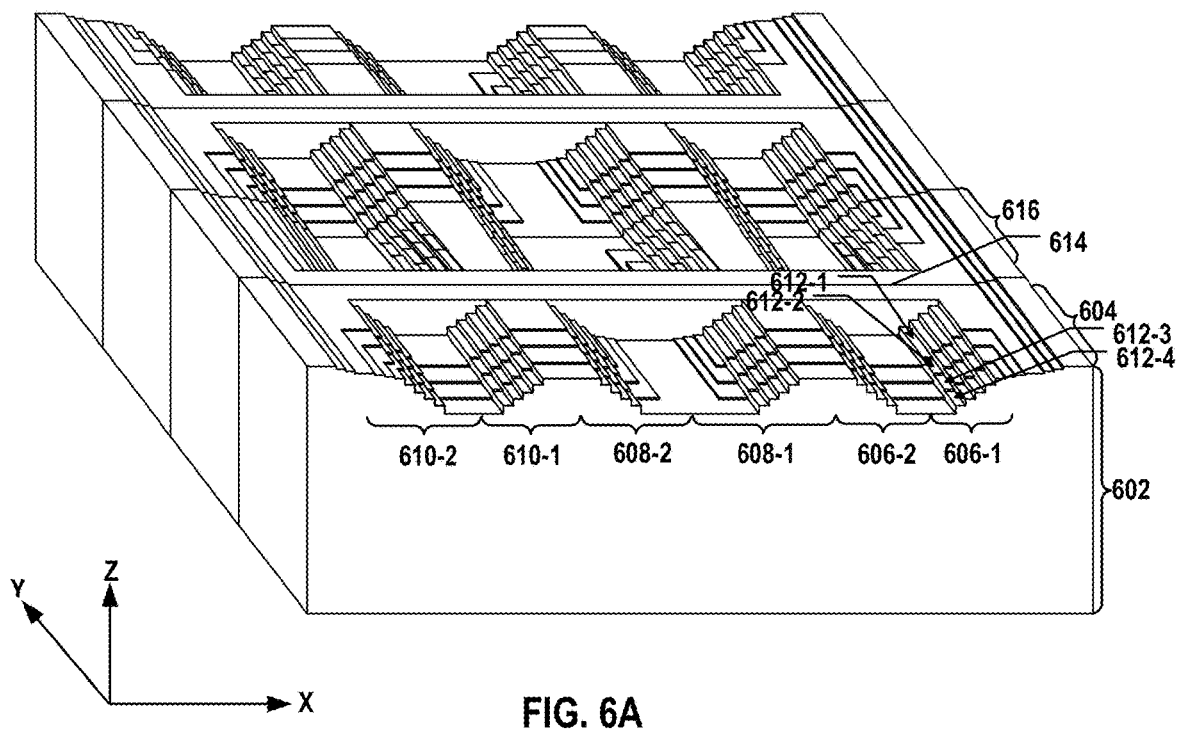
FIGS. 6A and 6B illustrate a fabrication process for forming an exemplary staircase structure of a 3D memory device, according to various embodiments of the present disclosure.
Figure 6B:
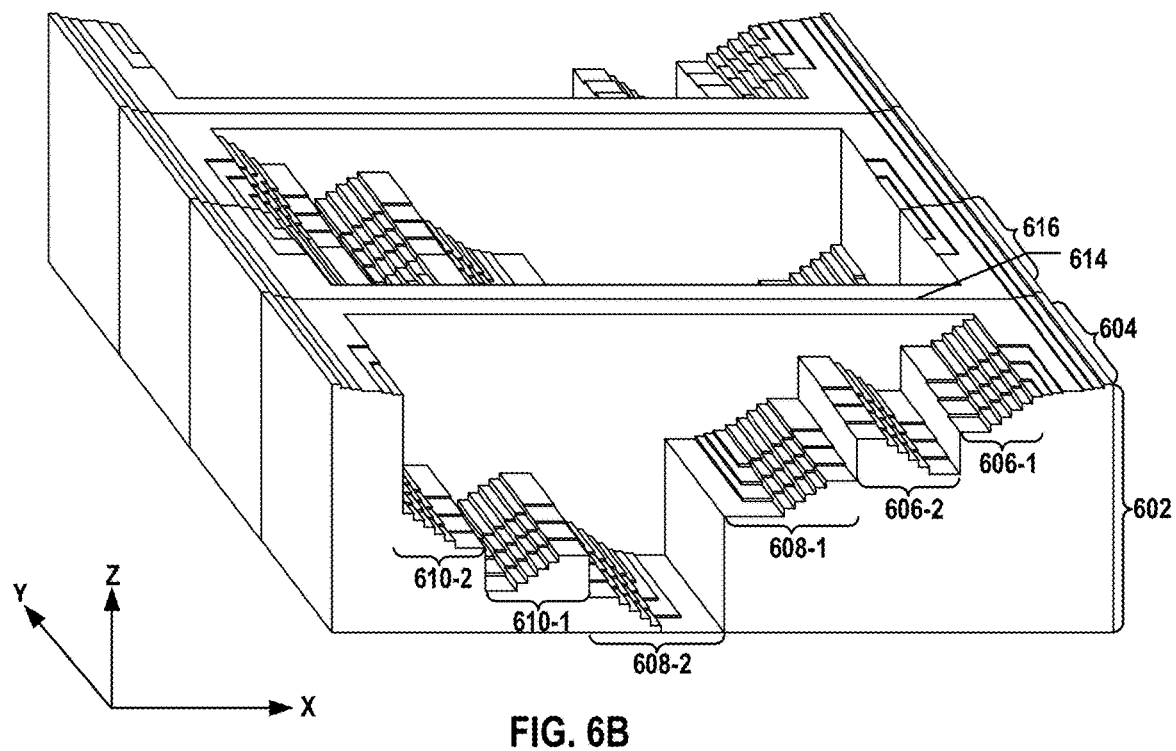
Figure 7A:
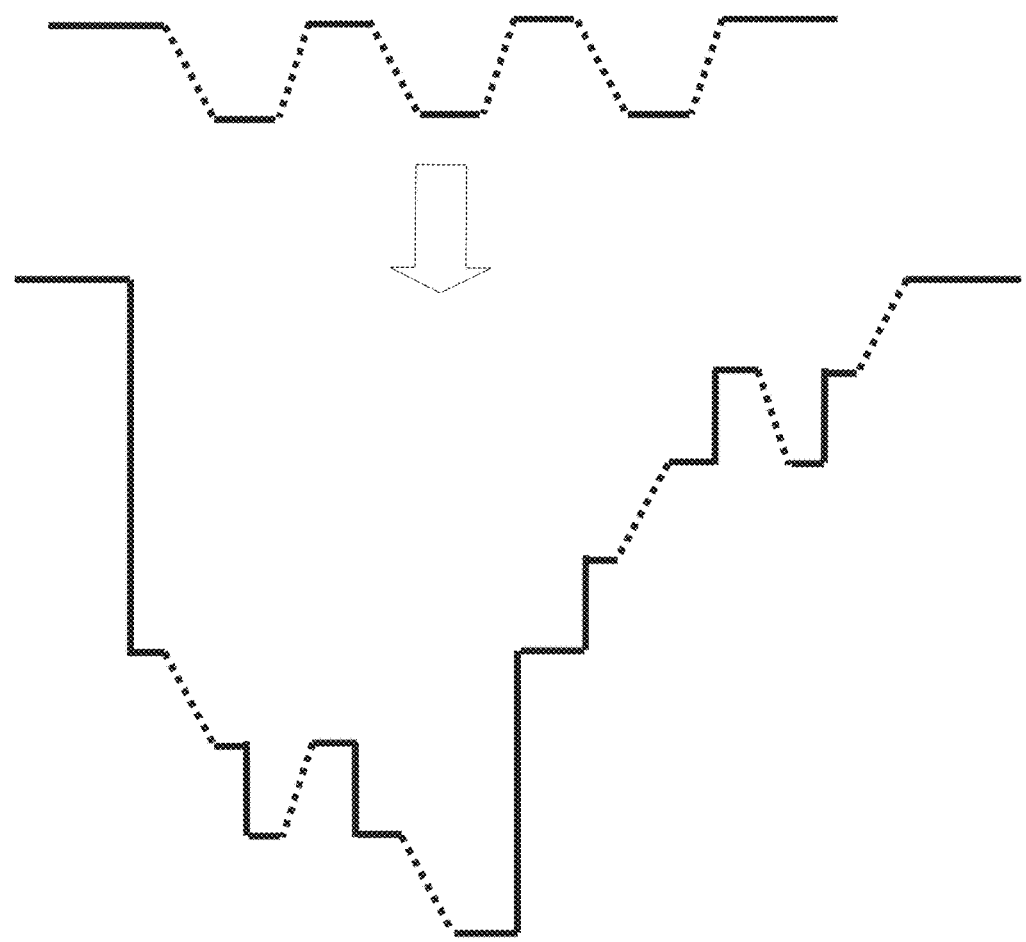
FIGS. 7A-7D illustrate various exemplary schemes of chopping staircases to different depths in a staircase structure, according to some embodiments of the present disclosure.
Figure 7B:
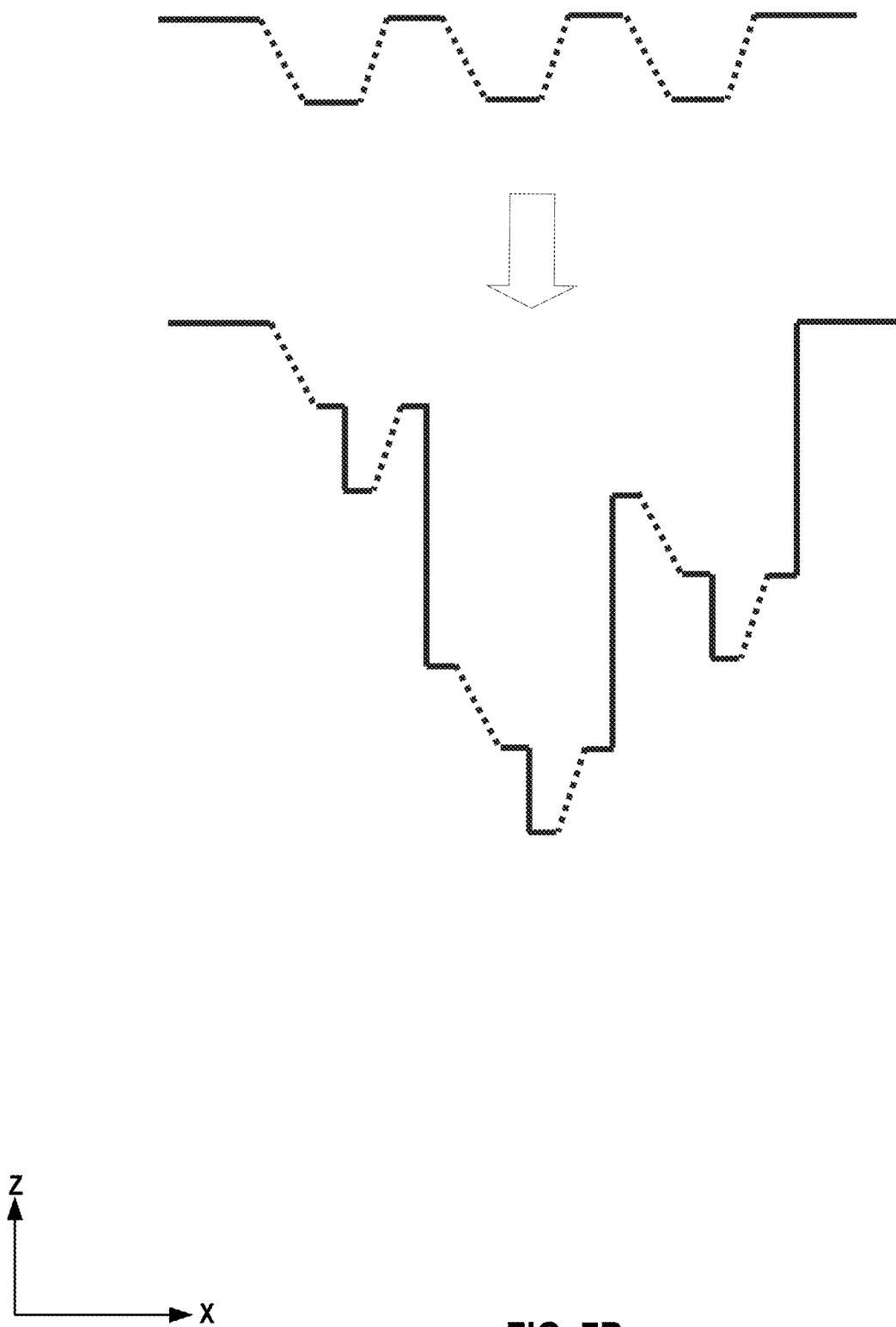
Figure 7C:
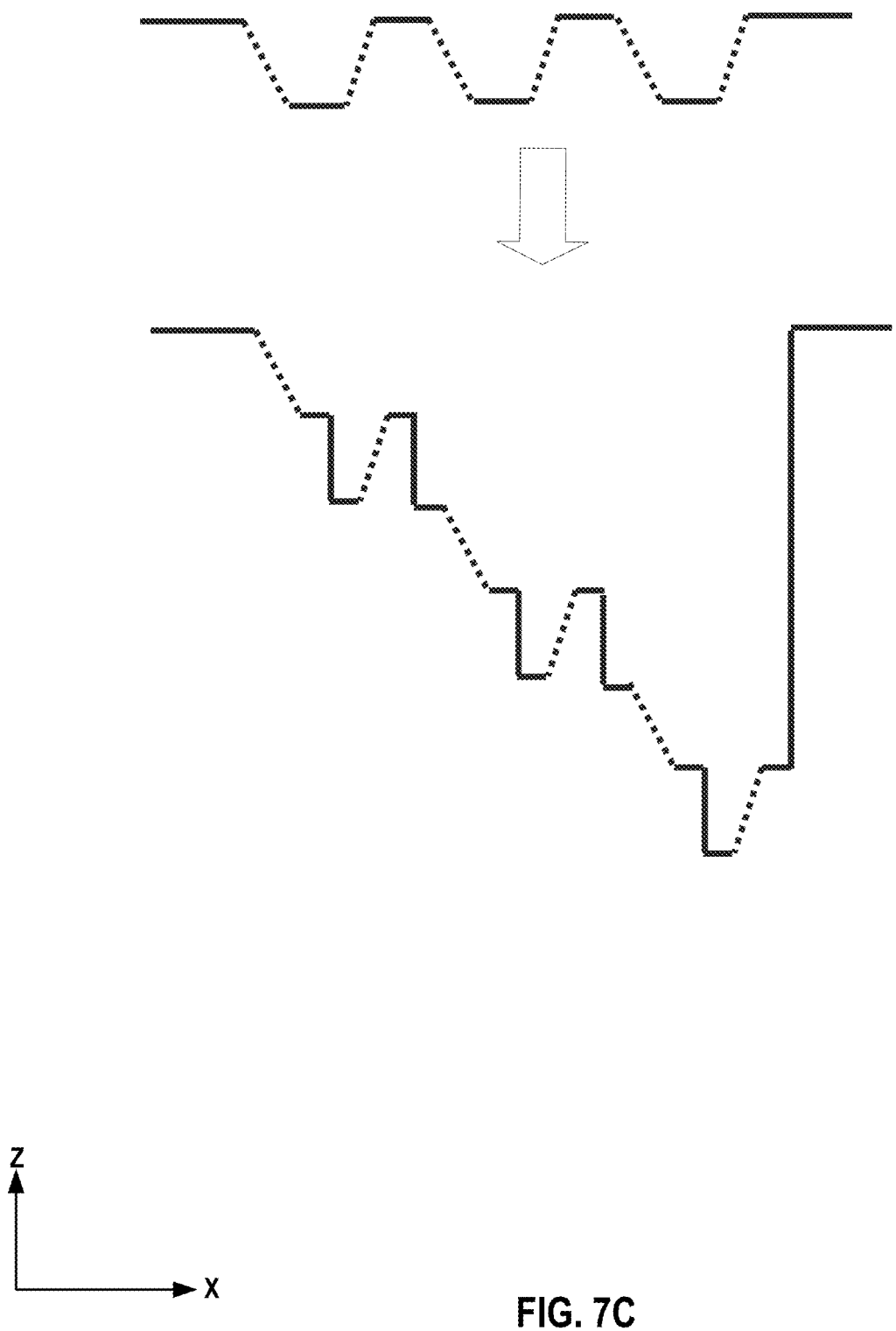
Figure 7D:
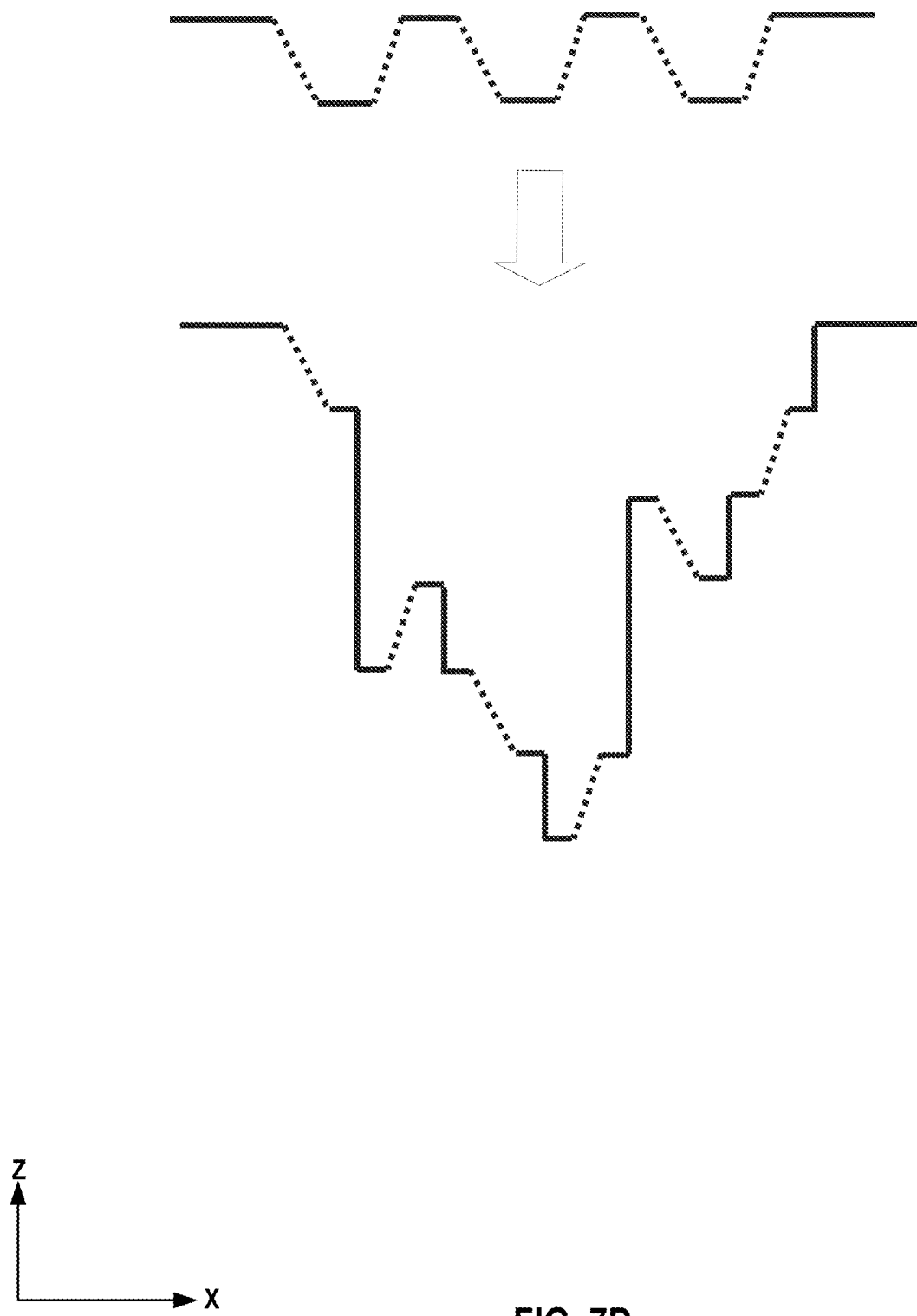

Referring to FIG. 5A, a staircase zone mask 502 is patterned on stack structure 602 (shown in FIG. 6A). Staircase zone mask 502 includes openings 508-1 and 508-2 for a plurality of staircase zones including a first staircase zone and a second staircase zone in the intermediate (e.g., the middle) of stack structure 602 (shown in FIG. 6A) in the x-direction (the word line direction). Stack structure 602 can include a plurality of blocks 504 in the y-direction (the bit line direction) separated by parallel GLSs 506. Each opening 508-1 or 508-2 is in two blocks 504 across a respective GLS 506 therebetween, according to some embodiments, as shown in FIG. 5A. It is understood that in another example, each opening 508-1 or 508-2 may be in one block 504 without crossing GLS 506. As staircase zone mask 502 can be used to define the staircase zones in the staircase structure through openings 508-1 and 508-2, each staircase zone can correspond to one or two blocks in the final product of a 3D memory device. As shown in FIG. 5A, staircase zone mask 502 covers a bridge structure 510 between adjacent openings 508-01 and 508-2 in the y-direction, according to some embodiments. Bridge structures 510 in staircase zone mask 502 can define the areas in which the bridge structures in the staircase structure in final product of the 3D memory device can be formed, and openings 508-1 and 508-2 in staircase zone mask 502 can define the areas in which the staircases in the staircase structure in the final product of the 3D memory device can be formed. Referring to FIG. 6A, staircase zones 604 and 616 are defined by openings 508-1 and 508-2, respectively, in staircase zone mask 502, and a bridge structure 614 between staircase zones 604 and 616 in the y-direction is covered by bridge structure 510 in staircase zone mask 502, according to some embodiments.

In some embodiments, staircase zone mask 502 is a hard mask, as opposed to a soft mask (e.g., a photoresist mask), which can be made of materials that can sustain the various processes until the staircase structure is formed, for example, can remain until at least the chopping process at operation 808 described below. Staircase zone mask 502 can thus protect the covered parts of stack structure 602 (e.g., bridge structure 614) during the subsequent processes until staircase zone mask 502 is removed, leaving the covered parts of stack structure 602 (and the interleaved first and second material layers therein) intact. Staircase zone mask 502 can be made of, for example, polysilicon, high dielectric constant (high-k) dielectrics, titanium nitride (TiN), or any other suitable hard mask materials. Staircase zone mask 502 can be formed by first depositing a hard mask material layer on stack structure 602 using one or more thin film deposition processes including, but not limited to, CVD, PVD, ALD, electroplating, electroless plating, or any combination thereof. The hard mask material layer then can be patterned to form openings 508-1 and 508-2 using lithography and dry etch and/or wet etch processes, such as reactive ion etch (RIE). In some embodiments, prior to the formation of staircase zone mask 502, TSG cut staircases in each pair of peripheral regions (e.g., peripheral regions 303 in FIG. 3) are formed adjacent to openings 508-1 and 508-2 in the x-direction.

Optionally, method 800 proceeds to operation 804, as illustrated in FIG. 8, in which in each of the first and second staircase zones, a plurality of divisions in the second lateral direction are formed at different depths. Referring to FIG. 9, to form the divisions, a division mask including openings in the first and second staircase zones is patterned at operation 902, and the plurality of divisions at different depths are formed by one or more trim-etch cycles according to the division mask at operation 904. It is understood that operation 804 may be skipped in some examples in which a multi-division staircase structure is not used.

Figure 5B:
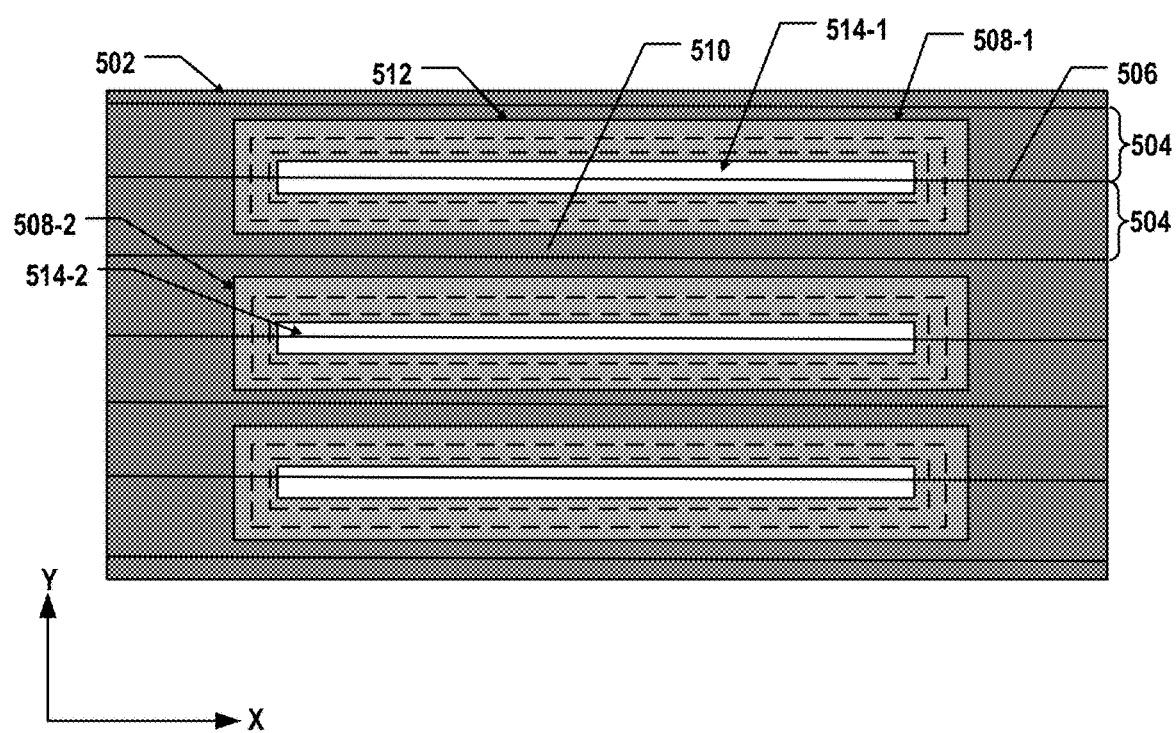

As illustrated in FIG. 5B, a division mask 512 is patterned on staircase zone mask 502. Division mask 512 includes openings 514-1 and 514-2 in openings for first and second staircase zones 508-1 and 508-2, respectively, for forming divisions in the y-direction, according to some embodiments. In some embodiments, division mask 512 is a soft mask (e.g., a photoresist mask), which can be trimmed in the trim-etch process for forming the divisions in the y-direction. Each opening 514-1 or 514-2 can have a nominally rectangular shape. The solid lines of openings 514-1 and 514-2 in FIG. 5B illustrate the boundaries of photoresist layers covering underneath stack structure 602 (shown in FIG. 6A). Bridge structure 510 remains on division mask 512 to cover underneath bridge structure 614 (shown in FIG. 6A), according to some embodiments. In some embodiments, division mask 512 is formed by coating a photoresist layer on staircase zone mask 502 using spin coating and patterning the coated photoresist layer using lithography and development processes. Division mask 512 can be used as an etch mask to etch the exposed portions of stack structure 602.

As illustrated in FIG. 6A, a plurality of divisions (e.g., four divisions 612-1, 612-2, 612-3, and 612-4) at different depths are formed by one or more trim-etch cycles (e.g., two trim-etch cycles) in the y-direction according to division mask 512 (shown in FIG. 5B). Division mask 512 having openings 514-1 and 514-2 (represented by the solid lines) can be used as the first etch mask. The parts of stack structure 602 uncovered by the first etch mask can be etched by a division depth using wet etch and/or dry etch processes. Any suitable etchants (e.g., of wet etching and/or dry etching) can be used to remove a certain thickness (e.g., the division depth) of stack structure 602 in the exposed portions. The etched thickness (e.g., the division depth) can be controlled by etch rate and/or etch time. In some embodiments, the division depth is nominally the same as the thickness of a material layer pair (e.g., a dielectric layer pair or a conductive/dielectric layer pair). It is understood that in some embodiments, the division depth is multiple times of the thickness of a material layer pair.

As illustrated in FIG. 5B, division mask 512 can be trimmed (e.g., etched incrementally and inwardly). The dashed lines of openings 514-1 and 514-2 illustrate the boundaries of the trimmed photoresist layers covering underneath stack structure 602. Each of openings 514-1 and 514-2 can be trimmed in both the x-direction and y-direction because of its rectangular shape. Division mask 512 having trimmed openings 514-1 and 514-2 (represented by the dashed lines) can be used as the second etch mask.

As illustrated in FIG. 6A, the amount of the photoresist layer trimmed from the first etch mask can be controlled by trim rate and/or trim time and can be directly relevant (e.g., determinant) to the dimensions of the resulting divisions. The trim of the first etch mask can be performed using any suitable etching process, e.g., isotropic dry etching or wet etching. The trim of the first etch mask can cause the part of stack structure 602 uncovered by the first etch mask to be enlarged. The enlarged uncovered portions of stack structure 602 can be etched again using the trimmed first etch mask as the second etch mask to form more divisions at different depths in each staircase zone 604 or 616. Any suitable etchants (e.g., of wet etching and/or dry etching) can be used to remove a certain thickness (e.g., the division depth) of stack structure 602 in the enlarged exposed portions. The etched thickness (e.g., the division depth) can be controlled by etch rate and/or etch time. In some embodiments, the etched thickness is nominally the same as the etched thickness in the previous etching step. As a result, the depth offset between adjacent divisions is nominally the same. It is understood that in some embodiments, the etched thicknesses are different in different etching steps such that the depth offsets are different between adjacent divisions. The trim process of a photoresist mask followed by the etching process of a stack structure is referred to herein as a trim-etch cycle. The number of trim-etch cycles can determine the number of divisions formed according to division mask 512. In some embodiments, bridge structure 614 remains intact after the formation of divisions 612-1, 612-2, 612-3, and 612-4 by multiple trim-etch cycles (e.g., two trim-etch cycles) due to the protection from bridge structure 510 in division mask 512 (shown in FIG. 5B), which is not trimmed.

Although FIG. 6A illustrates an example of forming a four-division staircase structure including four divisions 612-1, 612-2, 612-3, and 612-4 at different depths in each staircase zone 604 or 616, it is understood that a multi-division staircase structure and fabrication method thereof are not limited to four-division and may be any integer larger than one by changing the number of trim-etch cycles as well as the design of division mask 512 accordingly.

Method 800 proceeds to operation 806, as illustrated in FIG. 8, in which in each of the first and second staircase zones, at least one pair of staircases facing each other in a first lateral direction are formed at the same depth, such that a bridge structure is formed between the first and second staircase zones in a second lateral direction perpendicular to the first lateral direction. In some embodiments, each staircase of the at least one pair of staircases includes a plurality of stairs in the first lateral direction. In some embodiments in which the divisions are formed in the second lateral direction at operation 804, operation 806 is performed after operation 804. That is, the divisions in the second lateral direction are formed prior to the staircases in the first lateral direction. Referring to FIG. 9, to form the staircases, a staircase mask including openings in the first lateral direction is patterned at operation 906, and the at least one pair of staircases are formed at the same depth by a plurality of trim-etch cycles according to the staircase mask at operation 908.

Figure 5C:
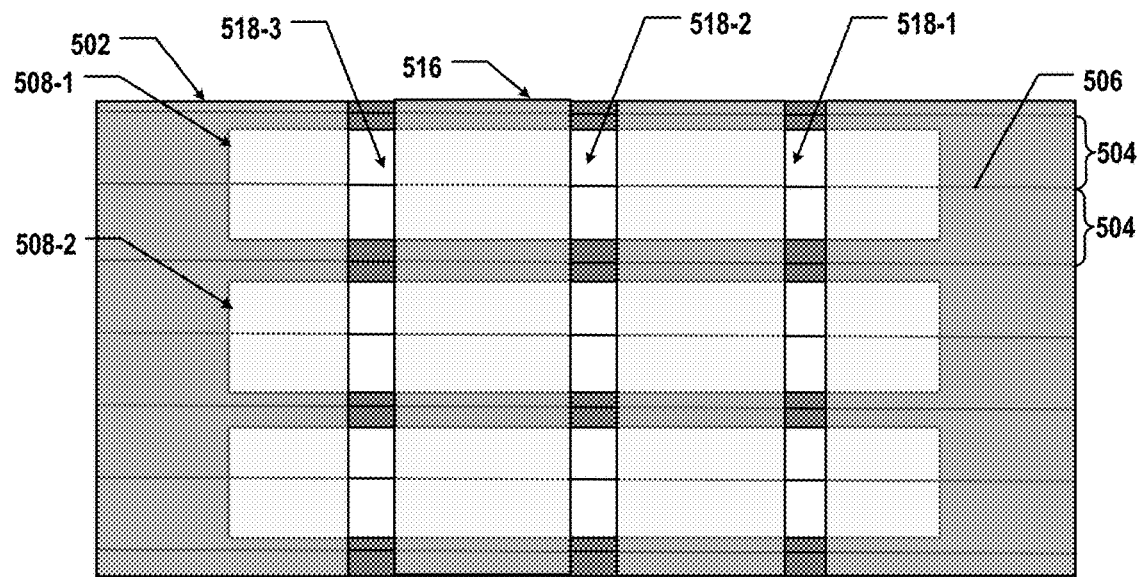

As illustrated in FIG. 5C, division mask 512 (shown in FIG. 5B) is removed once divisions 612-1, 612-2, 612-3, and 612-4 are formed, and a staircase mask 516 is patterned on staircase zone mask 502. Staircase mask 516 includes openings 518-1, 518-2, and 518-3 in the x-direction each for forming a pair of staircases facing each other at the same depth, according to some embodiments. It is understood that the number of openings 518-1, 518-2, and 518-3 may determine the number of pairs of staircases facing each other to be formed and thus, may be any suitable number depending on the arrangement of the staircase structure in the final product of the 3D memory device. In some embodiments, staircase mask 516 is a soft mask (e.g., a photoresist mask), which can be trimmed in the trim-etch process for forming the staircases in the x-direction. Each opening 518-1, 518-2, or 518-3 can have a nominally rectangular shape and extend across openings 508-1 and 508-2 of the staircase zones. The solid lines of openings 518-1, 518-2, and 518-3 in FIG. 5C illustrate the boundaries of photoresist layers covering underneath stack structure 602 (shown in FIG. 6A). In some embodiments, staircase mask 516 is formed by coating a photoresist layer on staircase zone mask 502 using spin coating and patterning the coated photoresist layer using lithography and development processes. Staircase mask 516 can be used as an etch mask to etch the exposed portions of stack structure 602.

As illustrated in FIG. 6A, a plurality of pairs of staircases (e.g., three pairs of staircases 606-1/606-2, 608-1/608-2, and 610-1/610-2) are formed at the same depth in each staircase zone 604 or 616 by a plurality of trim-etch cycles according to staircase mask 516 (shown in FIG. 5C). Bridge structure 614 is formed between staircase zones 604 and 616 in the y-direction, according to some embodiments. Each pair of staircases 606-1/606-2, 608-1/608-2, or 610-1/610-2 face each other in the x-direction and are at the same depth, according to some embodiments. Taking one pair of staircases 606-1/606-2 as an example, staircase 606-1 may tilt toward the negative x-direction, and staircase 606-2 may tilt toward the positive x-direction. Each staircase 606-1, 606-2, 608-1, 608-2, 610-1, or 610-2 can include the same number of stairs in the x-direction. In some embodiments, the number of pairs of staircases (e.g., three pairs of staircases 606-1/606-2, 608-1/608-2, and 610-1/610-2) in each staircase zone 604 or 616 is determined based on the number of openings (e.g., three openings 518-1, 518-2, and 518-3) in staircase mask 516, and the number of stairs in each staircase is determined based on the number of trim-etch cycles. In some embodiments, as shown in FIG. 6A, multiple divisions 612-1, 612-2, 612-3, and 612-4 are formed prior to the formation of staircases 606-1, 606-2, 608-1, 608-2, 610-1, and 610-2, such that each staircase 606-1, 606-2, 608-1, 608-2, 610-1, or 610-2 includes multiple divisions 612-1, 612-2, 612-3, and 612-4.

The trim-etch process for forming staircases 606-1, 606-2, 608-1, 608-2, 610-1, and 610-2 is described above in detail and thus, is not repeated for ease of description. The dimensions of each stair in staircases 606-1, 606-2, 608-1, 608-2, 610-1, and 610-2 can be determined by the amount of the trimmed photoresist layer in staircase mask 516 in each cycle (e.g., determining the dimension in the x-direction) and by the etched thickness in each cycle (e.g., determining the depth in the z-direction). In some embodiments, the amount of trimmed photoresist layer in each cycle is nominally the same, so that the dimension of each stair in staircases 606-1, 606-2, 608-1, 608-2, 610-1, and 610-2 in the x-direction is nominally the same. In some embodiments, the etched thickness in each cycle is nominally the same, so that the depth of each stair in staircases 606-1, 606-2, 608-1, 608-2, 610-1, and 610-2 is nominally the same. As the same trim-etch process (e.g., the same number of trim-etch cycles) is applied simultaneously through openings 518-1, 518-2, and 518-3 of staircase mask 516, each staircase 606-1, 606-2, 608-1, 608-2, 610-1, or 610-2 can have the same depth. For example, a first pair of staircases 606-1/606-2 may be formed through opening 518-1, a second pair of staircases 608-1/608-2 may be formed through opening 518-2, and a third pair of staircases 610-1/610-2 may be formed through opening 518-3. Bridge structure 614 remains intact during the trim-etch process, according to some embodiments.

Method 800 proceeds to operation 808, as illustrated in FIG. 8, in which in each of the first and second staircase zones, each staircase of the at least one pair of staircases are chopped to different depths. In some embodiments, after chopping each staircase, at least one stair of each staircase is connected to a remainder of the stack structure covered by the staircase zone mask through the bridge structure by at least one of the sacrificial layers or by at least one of the conductive layers. Referring to FIG. 9, to chop the staircases, a first chop mask including first openings in the first and second staircase zones is patterned at operation 910, and a first set of the staircases exposed by the first openings are chopped by a first depth by a plurality of etch cycles according to the first chop mask at operation 912. In some embodiments, to chop the staircases, a second chop mask including second openings in the first and second staircase zones is patterned at operation 914, and a second set of the staircases exposed by the second openings are chopped by a second depth by a plurality of etch cycles according to the second chop mask at operation 916.

Figure 5D:
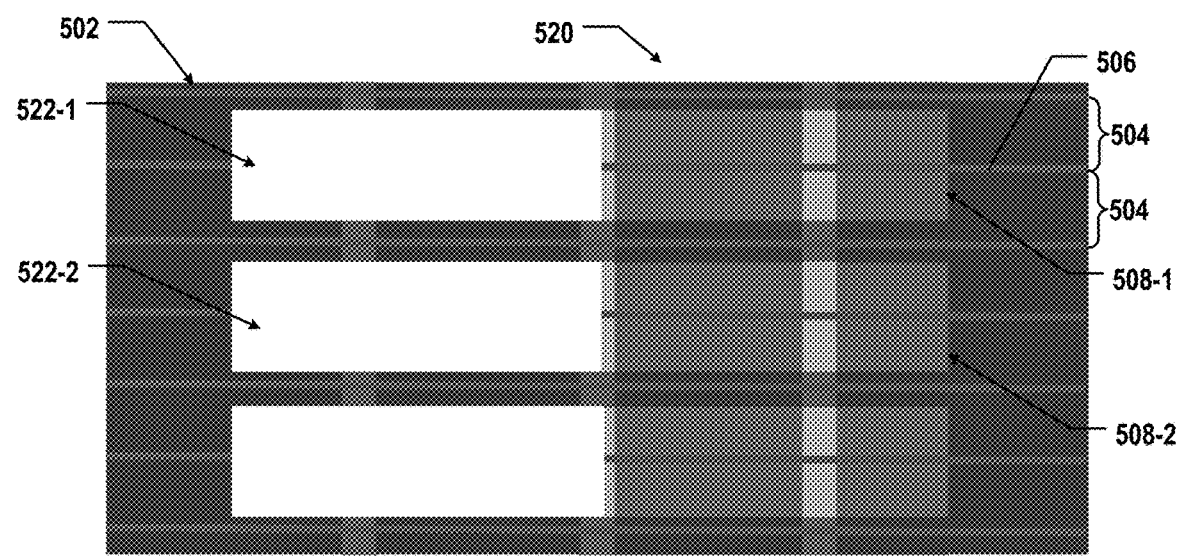

As illustrated in FIG. 5D, staircase mask 516 (shown in FIG. 5C) is removed once staircases 606-1, 606-2, 608-1, 608-2, 610-1, and 610-2 are formed, and a first chop mask 520 is patterned on staircase zone mask 502. First chop mask 520 includes openings 522-1 and 522-2 in openings of first and second staircase zones 508-1 and 508-2, respectively, for chopping a first set of staircases exposed by openings 522-1 and 522-2 by the same first depth, according to some embodiments. Openings 522-1 and 522-2 in first chop mask 520 correspond to staircases 610-2, 610-1, and 608-2 (shown in FIGS. 6A and 6B), so that only staircase 610-2, 610-1, and 608-2 can be chopped by the first depth according to first chop mask 520. As first chop mask 520 does not need to be trimmed, first chop mask 520 can be either a hard mask or a soft mask. Each opening 522-1 or 522-2 has a nominally rectangular shape and is in a respective opening of staircase zone 508-1 or 508-2. In some embodiments in which first chop mask 520 is a soft mask, first chop mask 520 is formed by coating a photoresist layer on staircase zone mask 502 using spin coating and patterning the coated photoresist layer using lithography and development processes. In some embodiments in which first chop mask 520 is a hard mask, first chop mask 520 is formed by first depositing a hard mask material layer on staircase zone mask 502 using one or more thin film deposition processes including, but not limited to, CVD, PVD, ALD, electroplating, electroless plating, or any combination thereof. The hard mask material layer then can be patterned to form openings 522-1 and 522-2 using lithography and dry etch and/or wet etch processes, such as RIE. First chop mask 520 can be used as an etch mask to chop the exposed first set of staircases 610-2, 610-1, and 608-2 by the same first depth.

As used herein, a "chopping" process is a process that reduces the depth of one or more staircases by a plurality of etch cycles. Each etch cycle can include one or more dry etch and/or wet etch processes that etches one stair, i.e., reducing the depth by one stair depth. As described above in detail, the purpose of the chopping process is to make each staircase (and each stair thereof) in the final product of the 3D memory device at different depths, according to some embodiments. Accordingly, depending on the number of staircases, a certain number of chopping processes may be needed.

Figure 5E:
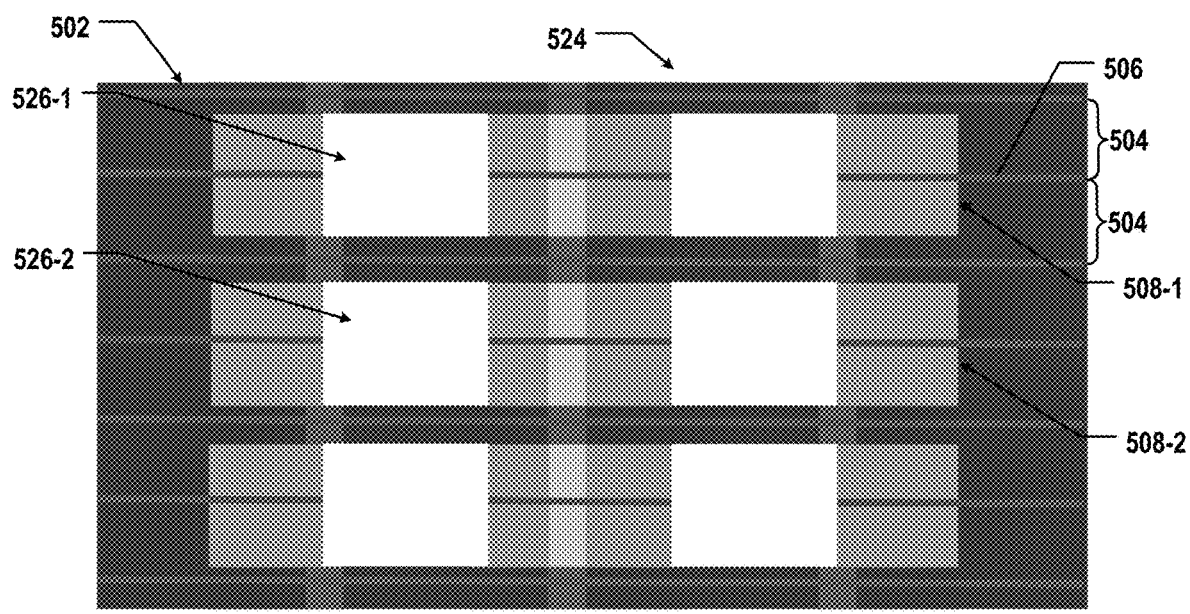

As illustrated in FIG. 5E, first chop mask 520 (shown in FIG. 5D) is removed once a first set of staircases 610-1, 610-2, and 608-2 are chopped, a second chop mask 524 is patterned on staircase zone mask 502. Second chop mask 524 includes openings 526-1 and 526-2 in openings of first and second staircase zones 508-1 and 508-2, respectively, for chopping a second set of staircases exposed by openings 526-1 and 526-2 by the same second depth, according to some embodiments. Openings 526-1 and 526-2 in second chop mask 524 correspond to staircases 610-1, 608-2, 608-1, and 606-2 (shown in FIGS. 6A and 6B), so that only staircase 610-1, 608-2, 608-1, and 606-2 can be chopped by the second depth according to second chop mask 524. Similar to first chop mask 520, second chop mask 524 can be either a hard mask or a soft mask. Second chop mask 524 can be used as an etch mask to chop the exposed second set of staircases 610-1, 608-2, 608-1, and 606-2 by the same second depth. After the second chopping process according to second chop mask 524, some staircases (e.g., 610-1 and 608-2) are chopped twice by the sum of first and second depths, some staircases (e.g., 610-2) are chopped once by the first depth, some staircases (e.g., 608-1 and 606-2) are chopped once by the second depth, and some staircases (e.g., 606-1) are not chopped yet.

Figure 5F:
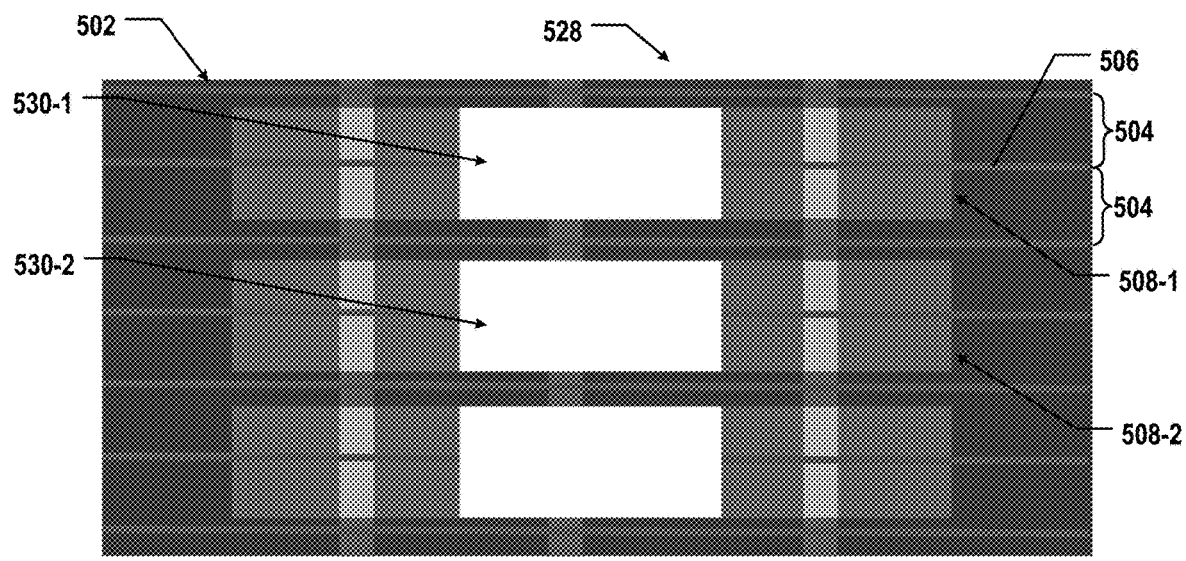

One or more chop masks and chopping process may be needed to make each staircase 606-1, 606-2, 608-1, 608-2, 610-1, or 610-2 at different depths. For example, as illustrated in FIG. 5F, second chop mask 524 (shown in FIG. 5E) may be removed once a second set of staircases 610-1, 608-2, 608-1, and 606-2 are chopped, and a third chop mask 528 may be patterned on staircase zone mask 502. Third chop mask 528 includes openings 530-1 and 530-2 in openings of first and second staircase zones 508-1 and 508-2, respectively, for chopping a third set of staircases exposed by openings 530-1 and 530-2 by the same third depth, according to some embodiments. Openings 530-1 and 530-2 in third chop mask 528 correspond to staircases 608-2 and 608-1 (shown in FIGS. 6A and 6B), so that only staircase 608-2 and 608-1 can be chopped by the third depth according to third chop mask 528. Similar to first and second chop masks 520 and 524, third chop mask 528 can be either a hard mask or a soft mask. Third chop mask 528 can be used as an etch mask to chop the exposed third set of staircases 608-2 and 608-1 by the same third depth. As a result, after the third chopping process according to third chop mask 528, each staircase 606-1, 606-2, 608-1, 608-2, 610-1, or 610-2 can have different depths.

In some embodiments, staircase zone mask 502 is removed after the third chopping process, i.e., the finish of the chopping process, for example, using wet etch and/or dry etch processes. That is, staircase zone mask 502 remains on stack structure 602 until at least the chopping process at operation 808 to protect the interleaved first and second material layers in bridge structures 614 of the staircase structure as well as the memory array structure from being etched by the various trim-etch processes and chopping process, according to some embodiments.

It is understood that first, second, and third chop masks 520, 524, and 528 and the first, second, and third chopping processes described above are one example of chopping staircases 606-1, 606-2, 608-1, 608-2, 610-1, and 610-2, and other suitable chopping schemes (including various chop masks and chopping processes) may be used to achieve the same result. It is further understood that various chopping schemes may achieve the same effect that each staircase in the staircase structure in the final product of a 3D memory device have different depths. For example, FIGS. 7A-7D illustrate various exemplary schemes of chopping staircases to different depths in a staircase structure, according to some embodiments of the present disclosure. Each figure of FIGS. 7A-7D illustrates one exemplary chopping scheme that can chop six staircases (represented by dashed lines in FIGS. 7A-7D) to different depths. As described above, the number of chop masks, the sequence of the chop masks, the design (e.g., the number and pattern of openings) of each chop mask, and/or the reduced depth by each chopping process (e.g., the number of etch cycles) may affect the specific depth of each staircase after the chopping process albeit the staircases are at different depths.

According to one aspect of the present disclosure, a 3D memory device includes a memory array structure and a staircase structure in an intermediate of the memory array structure and laterally dividing the memory array structure into a first memory array structure and a second memory array structure. The staircase structure includes a first staircase zone and a bridge structure connecting the first memory array structure and the second memory array structure. The first staircase zone includes a first pair of staircases facing each other in a first lateral direction and at different depths. Each staircase includes a plurality of stairs. At least one stair in the first pair of staircases is electrically connected to at least one of the first memory array structure and the second memory array structure through the bridge structure.

In some embodiments, each staircase of the first pair of staircases includes a plurality of divisions in a second lateral direction perpendicular to the first lateral direction. In some embodiments, a stair in one of the divisions is vertically between two stairs in another one of the divisions.

In some embodiments, the memory array structure includes a plurality of blocks in the second lateral direction. In some embodiments, the first staircase zone is in one or two of the blocks.

In some embodiments, the staircase structure further comprises a second staircase zone. In some embodiments, the bridge structure is between the first staircase zone and the second staircase zone in the second lateral direction.

In some embodiments, the second staircase zone includes a second pair of staircases facing each other in the first lateral direction and at different depths. In some embodiments, the first staircase zone and the second staircase zone are asymmetric in the second lateral direction.

In some embodiments, the first staircase zone comprises a second pair of staircases facing each other in the first lateral direction and at different depths. In some embodiments, each staircase of the first and second pairs of staircases are at different depths. In some embodiments, each stair in the first and second pairs of staircases are at different depths.

In some embodiments, the 3D memory device further includes at least one word line extending laterally in the memory array structure and the bridge structure, such that the at least one stair is electrically connected to the at least one of the first and second memory array structures through the bridge structure by the at least one word line.

In some embodiments, the at least one stair in the first pair of staircases is electrically connected to each one of the first memory array structure and the second memory array structure through the bridge structure.

In some embodiments, the bridge structure includes vertically interleaved conductive layers and dielectric layers.

According to another aspect of the present disclosure, a 3D memory device includes a memory array structure and a staircase structure in an intermediate of the memory array structure and laterally dividing the memory array structure into a first memory array structure and a second memory array structure. The staircase structure includes a first staircase zone and a bridge structure connecting the first memory array structure and the second memory array structure. The first staircase zone includes a first staircase including a plurality of divisions in a second lateral direction. Each division includes a plurality of stairs in a first lateral direction perpendicular to the second lateral direction. A stair in one of the divisions is vertically between two stairs in another one of the divisions. At least one stair in the first staircase is electrically connected to at least one of the first memory array structure and the second memory array structure through the bridge structure.

In some embodiments, the first staircase zone further includes a second staircase. In some embodiments, the first staircase and the second staircase face each other in the first lateral direction and have different depths.

In some embodiments, each stair in the first and second staircases are at different depths. In some embodiments, each stair in the first and second staircases is electrically connected to at least one of the first and second memory array structures through the bridge structure.

In some embodiments, the memory array structure includes a plurality of blocks in the second lateral direction. In some embodiments, the first staircase zone is in one or two of the blocks.

In some embodiments, the staircase structure further comprises a second staircase zone. In some embodiments, the bridge structure is between the first staircase zone and the second staircase zone in the second lateral direction.

In some embodiments, the 3D memory device further includes at least one word line extending laterally in the memory array structure and the bridge structure, such that the at least one stair is electrically connected to the at least one of the first and second memory array structures through the bridge structure by the at least one word line.

In some embodiments, the at least one stair in the first pair of staircases is electrically connected to each one of the first memory array structure and the second memory array structure through the bridge structure.

In some embodiments, the bridge structure includes vertically interleaved conductive layers and dielectric layers.

In some embodiments, the staircase structure is in the middle of the memory array structure.

According to still another aspect of the present disclosure, a method for forming a staircase structure of a 3D memory device is disclosed. A staircase zone mask including openings for a first staircase zone and a second staircase zone in an intermediate of a stack structure including vertically interleaved first material layers and second material layers is patterned. In each of the first and second staircase zones, at least one pair of staircases facing each other in a first lateral direction at a same depth are formed, such that a bridge structure is formed between the first and second staircase zones in a second lateral direction perpendicular to the first lateral direction. In each of the first and second staircase zones, each staircase of the at least one pair of staircases is chopped to different depths.

In some embodiments, prior to forming the at least one pair of staircases, a plurality of divisions are formed in the second lateral direction at different depths, such that each staircase of the at least one pair of staircases comprises the plurality of divisions.

In some embodiments, to form the plurality of divisions, a division mask including openings in the first and second staircase zones is patterned, and the plurality of divisions are formed at different depths by one or more trim-etch cycles according to the division mask.

In some embodiments, the bridge structure is covered by the staircase zone mask or the division mask.

In some embodiments, to form the at least one pair of staircase, a staircase mask including openings in the first lateral direction is patterned, and the at least one pair of staircases are formed at the same depth by a plurality of trim-etch cycles according to the staircase mask.

In some embodiments, to chop each staircase, a first chop mask including first openings in the first and second staircase zones is formed, and a first set of the staircases exposed by the first openings are chopped by a first depth by a plurality of etch cycles according to the first chop mask.

In some embodiments, to chop each staircase, a second chop mask including second openings in the first and second staircase zones is formed, and a second set of the staircases exposed by the second openings are chopped by a second depth by a plurality of etch cycles according to the second chop mask.

In some embodiments, each of the first material layers includes a sacrificial layer, and each of the second material layers includes a dielectric layer.

In some embodiments, each of the first material layers includes a conductive layer, and each of the second material layers includes a dielectric layer.

In some embodiments, each staircase of the at least one pair of staircases includes a plurality of stairs in the first lateral direction. In some embodiments, after chopping each staircase, at least one stair of each staircase is connected to a remainder of the stack structure covered by the staircase zone mask through the bridge structure by at least one of the sacrificial layers or by at least one of the conductive layers.

In some embodiments, the staircase zone mask remains until at least chopping each staircase. In some embodiments, the staircase zone mask includes a hard mask.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a memory array structure comprising a first memory array structure and a second memory array structure;
a staircase structure between the first memory array structure and the second memory array structure in a first lateral direction, the staircase structure comprising a first staircase zone and a second staircase zone; and
a first bridge structure between the first staircase zone and the second staircase zone in a second lateral direction perpendicular to the first lateral direction, the first bridge structure having a first top surface that is nominally flat;
a second bridge structure between the first staircase zone and the second staircase zone in the second lateral direction, the second bridge structure having a second top surface that is nominally flat,
wherein the first bridge structure and the second bridge structure are separated by a gate line slit structure,
wherein each of the first staircase zone and the second staircase zone comprises:
first sub-staircases and second sub-staircases arranged alternately, each of the first sub-staircases comprising ascending stairs at different depths, each of the second sub-staircases comprising descending stairs at different depths; and
at least one stair in each of the first sub-staircases and the second sub-staircases is connected to the first memory array structure and the second memory array structure through the at least one of the first bridge structure and the second bridge structure.

2. The 3D memory device of claim 1, wherein
the first sub-staircases and the second sub-staircases of the first staircase zone and the first sub-staircases and the second sub-staircases of the second staircase zone are asymmetric in the second lateral direction.

3. The 3D memory device of claim 1, wherein
none of the first sub-staircases and the second sub-staircases is over-lapped in a third direction perpendicular to both the first lateral direction and the second lateral direction.

4. The 3D memory device of claim 1, wherein
the memory array structure comprises a plurality of blocks in the second lateral direction.

5. The 3D memory device of claim 4, wherein the first staircase zone and the second staircase zone are in different blocks.

6. The 3D memory device of claim 1, wherein the first bridge structure and the second bridge structure each comprise interleaved conductive layers and dielectric layers.

7. The 3D memory device of claim 1, wherein
each of the first sub-staircases and the second sub-staircases comprises a plurality of divisions in the second lateral direction; and
a stair in one of the divisions is vertically between two stairs in another one of the divisions.

8. A three-dimensional (3D) memory device, comprising:
a stack structure comprising interleaved conductive layers and dielectric layers; and
gate line slit structure extending through the stack structure in a first lateral direction and dividing the stack structure into a first block and a second block in a second lateral direction perpendicular to the first lateral direction, wherein
the stack structure further comprises a first bridge structure adjacent to a first staircase zone in the second lateral direction in the first block, the first bridge structure having a first top surface that is nominally flat, and a second bridge structure adjacent to a second staircase zone in the second lateral direction in the second block, the second bridge structure having a second top surface that is nominally flat,
the stack structure further comprises a first staircase zone in the first block and a second staircase zone in the second block;
each of the first staircase zone and the second staircase zone comprises first sub-staircases and second sub-staircases arranged alternately in the first lateral direction;
each of the first sub-staircases comprises a plurality of ascending stairs at different depths; and
each of the second sub-staircases comprises a plurality of descending stairs at different depths.

9. The 3D memory device of claim 8, wherein
the first sub-staircases and the second sub-staircases of the first staircase zone and the first sub-staircases and the second sub-staircases of the second staircase zone are asymmetric in the second lateral direction.

10. The 3D memory device of claim 8, wherein
none of the first sub-staircases and the second sub-staircases is over-lapped in a third direction perpendicular to both the first lateral direction and the second lateral direction.

11. The 3D memory device of claim 8, wherein
the first top surface and the second top surface are nominally coplanar.

12. The 3D memory device of claim 11, wherein at least one stair in the first staircase zone is connected to a first memory array structure and a second memory array structure in the first block through the first bridge structure.

13. The 3D memory device of claim 11, wherein at least one stair in the second staircase zone is connected to a first memory array structure and a second memory array structure in the second block through the second bridge structure.

14. The 3D memory device of claim 11, wherein each of the first bridge structure and the second bridge structure comprises interleaved conductive layers and dielectric layers.

15. The 3D memory device of claim 9, wherein
each of the first sub-staircases and the second sub-staircases comprises a plurality of stairs in the second lateral direction.

16. A three-dimensional (3D) memory device, comprising:
a memory array structure comprising a first memory array structure and a second memory array structure; and
a staircase structure between the first memory array structure and the second memory array structure in a first lateral direction, the staircase structure comprising a first staircase zone, and a first bridge structure having a first side adjacent to the first staircase zone in a second lateral direction perpendicular to the first lateral direction, and a second side, opposite the first side, adjacent to a gate line slit structure, the first bridge structure having a top surface that is nominally flat, wherein the first staircase zone comprises:
a first pair of staircases comprising first descending stairs and first ascending stairs at different depths;
a second pair of staircases comprising second descending stairs and second ascending stairs at different depths; and
a third pair of staircases comprising third descending stairs and third ascending stairs at different depths,
wherein the first staircase zone has a first length in the first lateral direction, the first bridge structure has a second length in the first lateral direction, and the first length and the second length are nominally the same.

17. The 3D memory device of claim 16, wherein none of the first pair of staircases, the second pair of staircases and the third pair of staircases is over-lapped in a vertical direction perpendicular to the first lateral direction.

18. The 3D memory device of claim 16, further comprising:
a second bridge structure adjacent to a second staircase zone in the second lateral direction perpendicular to the first lateral direction and a vertical direction.

19. The 3D memory device of claim 18, wherein at least one stair in the first staircase zone is connected to the first memory array structure and the second memory array structure through the first bridge structure.

20. The 3D memory device of claim 18, wherein the first bridge structure comprises interleaved conductive layers and dielectric layers.

* * * * *